(12) United States Patent
Myli et al.

(10) Patent No.: US 11,028,012 B2
(45) Date of Patent: Jun. 8, 2021

(54) LOW SOLAR HEAT GAIN COATINGS, LAMINATED GLASS ASSEMBLIES, AND METHODS OF PRODUCING SAME

(71) Applicant: Cardinal CG Company, Eden Prairie, MN (US)

(72) Inventors: Kari B. Myli, Sauk City, WI (US); Gary L. Pfaff, Hillpoint, WI (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 395 days.

(21) Appl. No.: 16/176,769

(22) Filed: Oct. 31, 2018

(65) Prior Publication Data
US 2020/0131084 A1    Apr. 30, 2020

(51) Int. Cl.
| | | |
|---|---|---|
| *B32B 15/04* | (2006.01) | |
| *B32B 17/06* | (2006.01) | |
| *C03C 17/36* | (2006.01) | |
| *B32B 17/10* | (2006.01) | |

(52) U.S. Cl.
CPC ...... *C03C 17/366* (2013.01); *B32B 17/10036* (2013.01); *C03C 17/3607* (2013.01); *C03C 17/3649* (2013.01); *C03C 17/3681* (2013.01); *B32B 2307/414* (2013.01); *C03C 2217/231* (2013.01); *C03C 2217/261* (2013.01); *C03C 2218/156* (2013.01)

(58) Field of Classification Search
CPC .............. C03C 17/366; C03C 17/3607; C03C 17/3649; C03C 17/3681; C03C 2217/231; B32B 17/10036; B32B 2307/414

USPC .......................................... 428/426, 428, 432
See application file for complete search history.

(56) References Cited

U.S. PATENT DOCUMENTS

| | | |
|---|---|---|
| 3,192,575 A | 7/1965 | Rosenau, Jr. et al. |
| 3,293,344 A | 12/1966 | Barnes et al. |
| 3,601,375 A | 8/1971 | Bowman |
| 3,655,545 A | 4/1972 | Gillery et al. |
| 3,962,488 A | 6/1976 | Gillery |
| 4,047,351 A | 9/1977 | Derner et al. |
| 4,065,600 A | 12/1977 | King et al. |
| 4,144,684 A | 3/1979 | Kirkbride et al. |
| 4,166,018 A | 8/1979 | Chapin |
| 4,399,015 A | 8/1983 | Endo et al. |
| 4,407,709 A | 10/1983 | Enjouji et al. |
| 4,490,227 A | 12/1984 | Bitter |

(Continued)

FOREIGN PATENT DOCUMENTS

| | | |
|---|---|---|
| CN | 103072341 A | 5/2013 |
| EP | 1641722 A1 | 4/2006 |

(Continued)

OTHER PUBLICATIONS

Chaudhuri et al., "Microstructure of indium tin oxide films produced by the D.C. sputtering technique," Thin Solid Films, vol. 148, No. 3, Apr. 1987, pp. 279-284.

(Continued)

*Primary Examiner* — Lauren R Colgan
(74) *Attorney, Agent, or Firm* — Fredrikson & Byron, PA (57) ABSTRACT

The invention provides transparent conductive coatings based on indium tin oxide. In some embodiments, the coating includes two indium tin oxide films and two nickel alloy films. Also provided are laminated glass assemblies that include such coatings.

32 Claims, 4 Drawing Sheets

(56) References Cited

U.S. PATENT DOCUMENTS

| | | | |
|---|---|---|---|
| 4,504,109 A | 3/1985 | Taga et al. | |
| 4,568,578 A | 2/1986 | Aristen et al. | |
| 4,583,815 A | 4/1986 | Taga et al. | |
| 4,654,509 A | 3/1987 | Robinson et al. | |
| RE32,497 E | 9/1987 | Canfield | |
| 4,698,486 A | 10/1987 | Sheets | |
| 4,737,379 A | 4/1988 | Hudgens et al. | |
| 4,789,771 A | 12/1988 | Robinson et al. | |
| 4,790,922 A | 12/1988 | Huffer | |
| 4,799,745 A * | 1/1989 | Meyer | B32B 17/10174 359/360 |
| 4,806,220 A | 2/1989 | Finley | |
| 4,883,721 A | 11/1989 | Nalepka et al. | |
| 4,941,302 A | 7/1990 | Barry | |
| 4,965,225 A | 10/1990 | Yamagishi et al. | |
| 4,966,676 A | 10/1990 | Fukasawa et al. | |
| 4,976,503 A | 12/1990 | Woodard | |
| 5,011,585 A | 4/1991 | Brochot et al. | |
| 5,059,295 A | 10/1991 | Finley | |
| H000975 H | 11/1991 | Selkowitz et al. | |
| 5,122,180 A | 6/1992 | Mathivat et al. | |
| 5,135,581 A | 8/1992 | Tran et al. | |
| 5,189,551 A | 2/1993 | Woodard | |
| 5,201,926 A | 4/1993 | Szczyrbowski et al. | |
| 5,225,273 A | 7/1993 | Mikoshiba et al. | |
| 5,242,560 A | 9/1993 | Lingle et al. | |
| 5,279,722 A | 1/1994 | Szczyrbowski et al. | |
| 5,288,527 A | 2/1994 | Jousse et al. | |
| 5,352,504 A | 10/1994 | Boulanger et al. | |
| 5,376,455 A | 12/1994 | Hartig et al. | |
| 5,387,433 A | 2/1995 | Balian et al. | |
| 5,425,861 A | 6/1995 | Hartig et al. | |
| 5,543,229 A | 8/1996 | Ohsaki et al. | |
| 5,552,180 A | 9/1996 | Finley et al. | |
| 5,584,902 A | 12/1996 | Hartig et al. | |
| 5,595,825 A | 1/1997 | Guiselin | |
| 5,630,918 A | 5/1997 | Takahara et al. | |
| 5,657,149 A | 8/1997 | Buffat et al. | |
| 5,663,829 A | 9/1997 | Lefrou et al. | |
| 5,677,240 A | 10/1997 | Murakami et al. | |
| 5,709,930 A | 1/1998 | Depauw | |
| 5,770,321 A | 6/1998 | Hartig et al. | |
| 5,793,518 A | 8/1998 | Lefrou et al. | |
| 5,827,409 A | 10/1998 | Iwata et al. | |
| 5,830,252 A | 11/1998 | Finley et al. | |
| 5,873,203 A | 2/1999 | Thiel | |
| 5,889,608 A | 3/1999 | Buffat et al. | |
| 5,935,702 A | 8/1999 | MacQuart et al. | |
| 6,021,152 A | 2/2000 | Olsen et al. | |
| 6,024,084 A | 2/2000 | Gerhardinger | |
| 6,033,536 A | 3/2000 | Ichihara et al. | |
| 6,045,896 A | 4/2000 | Boire et al. | |
| 6,060,178 A | 5/2000 | Krisko | |
| 6,114,043 A | 9/2000 | Joret | |
| 6,117,560 A | 9/2000 | Maloney | |
| 6,121,178 A | 9/2000 | Eshima et al. | |
| 6,148,563 A | 11/2000 | Roche et al. | |
| 6,159,607 A | 12/2000 | Hartig et al. | |
| 6,177,200 B1 | 1/2001 | Maloney | |
| 6,180,247 B1 | 1/2001 | Szczyrbowski et al. | |
| 6,218,018 B1 | 4/2001 | McKown et al. | |
| 6,221,520 B1 * | 4/2001 | Takaki | C23C 14/086 359/360 |
| 6,231,999 B1 | 5/2001 | Krisko | |
| 6,274,015 B1 | 8/2001 | Beier et al. | |
| 6,300,594 B1 | 10/2001 | Kinoshita et al. | |
| 6,315,874 B1 | 11/2001 | Suzuki et al. | |
| 6,318,027 B1 | 11/2001 | Richardson et al. | |
| 6,319,556 B1 | 11/2001 | Olsen et al. | |
| 6,329,044 B1 | 12/2001 | Inoue et al. | |
| 6,337,467 B1 | 1/2002 | Sik | |
| 6,340,529 B1 | 1/2002 | Ebisawa et al. | |
| 6,379,508 B1 | 4/2002 | Kobayashi et al. | |
| 6,383,345 B1 | 5/2002 | Kim et al. | |
| 6,416,890 B1 | 7/2002 | Terneu et al. | |
| 6,425,990 B1 | 7/2002 | Ishibashi | |
| 6,432,545 B1 | 8/2002 | Schicht et al. | |
| 6,454,886 B1 | 9/2002 | Martin et al. | |
| 6,468,403 B1 | 10/2002 | Shimizu et al. | |
| 6,472,072 B1 | 10/2002 | Ebisawa et al. | |
| 6,472,632 B1 | 10/2002 | Peterson et al. | |
| 6,475,354 B1 | 11/2002 | Toyama | |
| 6,495,251 B1 | 12/2002 | Arbab et al. | |
| 6,548,190 B2 | 4/2003 | Spitsberg et al. | |
| 6,551,715 B1 | 4/2003 | Seto et al. | |
| 6,555,250 B2 | 4/2003 | Shah et al. | |
| 6,562,490 B2 | 5/2003 | Ebisawa et al. | |
| 6,580,051 B2 | 6/2003 | Peterson et al. | |
| 6,600,127 B1 | 7/2003 | Peterson et al. | |
| 6,610,410 B2 | 8/2003 | Ebisawa et al. | |
| 6,617,056 B1 | 9/2003 | Nara et al. | |
| 6,623,846 B2 | 9/2003 | Laird | |
| 6,632,491 B1 | 10/2003 | Thomsen et al. | |
| 6,645,358 B2 | 11/2003 | Lupton et al. | |
| 6,650,478 B1 | 11/2003 | DeBusk et al. | |
| 6,653,591 B1 | 11/2003 | Peterson et al. | |
| 6,656,523 B2 | 12/2003 | Russo et al. | |
| 6,677,063 B2 | 1/2004 | Finley | |
| 6,699,585 B2 | 3/2004 | Ebisawa et al. | |
| 6,733,889 B2 | 5/2004 | Varanasi et al. | |
| 6,736,806 B2 | 5/2004 | Ruiz et al. | |
| 6,740,211 B2 * | 5/2004 | Thomsen | B32B 17/10036 156/109 |
| 6,740,416 B1 | 5/2004 | Yokogawa et al. | |
| 6,743,488 B2 | 6/2004 | Memanan et al. | |
| 6,764,779 B1 | 7/2004 | Liu et al. | |
| 6,767,081 B2 | 7/2004 | Shirakawa et al. | |
| 6,777,639 B2 | 8/2004 | Schroder et al. | |
| 6,783,861 B2 | 8/2004 | Ebisawa et al. | |
| 6,793,980 B2 | 9/2004 | Ohtsu et al. | |
| 6,808,606 B2 * | 10/2004 | Thomsen | B05D 5/083 204/192.26 |
| 6,849,165 B2 | 2/2005 | Klppel et al. | |
| 6,916,389 B2 | 7/2005 | Pesiri et al. | |
| 6,919,133 B2 | 7/2005 | Hartig et al. | |
| 6,924,037 B1 | 8/2005 | Joret et al. | |
| 6,942,923 B2 | 9/2005 | Stachowiak | |
| 6,955,833 B1 | 10/2005 | Gallego | |
| 6,955,925 B1 | 10/2005 | Donohue et al. | |
| 6,965,629 B2 | 11/2005 | Schroder et al. | |
| 7,012,214 B2 | 3/2006 | Schroder et al. | |
| 7,041,588 B2 | 5/2006 | Bender | |
| 7,081,302 B2 | 7/2006 | Lemmer et al. | |
| 7,083,857 B2 | 8/2006 | Sawada et al. | |
| 7,102,141 B2 | 9/2006 | Hwang et al. | |
| 7,115,837 B2 | 10/2006 | Timans et al. | |
| 7,117,914 B2 | 10/2006 | Chick | |
| 7,126,081 B2 | 10/2006 | Schroder et al. | |
| 7,143,800 B2 | 12/2006 | Chick | |
| 7,153,579 B2 | 12/2006 | Kriltz et al. | |
| 7,166,360 B2 | 1/2007 | Coustet et al. | |
| 7,183,229 B2 | 2/2007 | Yamanaka | |
| 7,189,624 B2 | 3/2007 | Ito | |
| 7,211,328 B2 | 5/2007 | Schicht et al. | |
| 7,220,936 B2 | 5/2007 | Ott et al. | |
| 7,232,615 B2 | 6/2007 | Buhay et al. | |
| 7,258,757 B2 | 8/2007 | Huang et al. | |
| 7,265,807 B2 | 9/2007 | Lifka et al. | |
| 7,276,457 B2 | 10/2007 | Yoo | |
| 7,279,405 B2 | 10/2007 | Itani et al. | |
| 7,291,816 B2 | 11/2007 | Chen | |
| 7,294,404 B2 | 11/2007 | Krisko et al. | |
| 7,300,832 B2 | 11/2007 | Ito et al. | |
| 7,335,421 B2 | 2/2008 | Thiel et al. | |
| 7,339,728 B2 | 3/2008 | Hartig | |
| 7,342,716 B2 | 3/2008 | Hartig | |
| 7,598,162 B2 | 4/2009 | Yamamoto et al. | |
| 7,527,868 B2 | 5/2009 | Grimal et al. | |
| 7,534,496 B2 | 5/2009 | Lemmer et al. | |
| 7,550,067 B2 | 6/2009 | Veerasamy | |
| 7,563,514 B2 | 7/2009 | Nakayama et al. | |
| 7,566,481 B2 | 7/2009 | Veerasamy | |
| 7,572,509 B2 | 8/2009 | Hartig | |
| 7,572,510 B2 | 8/2009 | Hartig | |

(56) References Cited

U.S. PATENT DOCUMENTS

| | | |
|---|---|---|
| 7,572,511 B2 | 8/2009 | Hartig |
| 7,582,356 B2 | 9/2009 | Brochot et al. |
| 7,597,962 B2 | 10/2009 | Butz et al. |
| 7,597,964 B2 | 10/2009 | Krasnov |
| 7,604,865 B2 | 10/2009 | Krisko et al. |
| 7,641,818 B2 | 1/2010 | Nakayama et al. |
| 7,709,361 B2 | 5/2010 | Suguro |
| 7,713,632 B2 | 5/2010 | Krisko et al. |
| 7,718,707 B2 | 5/2010 | Kelman et al. |
| 7,737,385 B2 | 6/2010 | Timans et al. |
| 7,744,955 B2 | 6/2010 | Blacker et al. |
| 7,782,296 B2 | 8/2010 | Kong et al. |
| 7,820,097 B2 | 10/2010 | Schroder et al. |
| 7,820,296 B2 | 10/2010 | Myli et al. |
| 7,820,309 B2 | 10/2010 | Myli et al. |
| 7,862,309 B2 | 1/2011 | Chen et al. |
| 7,862,910 B2 | 1/2011 | Krisko et al. |
| 7,923,114 B2 | 4/2011 | Myli et al. |
| 7,964,788 B2 | 6/2011 | den Boer et al. |
| 8,067,276 B2 | 11/2011 | Lee et al. |
| 8,080,141 B2 | 12/2011 | Krasnov |
| 8,088,473 B2 | 1/2012 | Hartig |
| 8,092,660 B2 | 1/2012 | Myli et al. |
| 8,211,785 B2 | 7/2012 | Itani et al. |
| 8,286,395 B2 | 10/2012 | Mauvemay et al. |
| 8,298,380 B2 | 10/2012 | Krasnov |
| 8,304,045 B2 | 11/2012 | Lemmer et al. |
| 8,313,620 B2 | 11/2012 | Krasnov |
| 8,318,572 B1 | 11/2012 | Shanker et al. |
| 8,337,988 B2 | 12/2012 | Knoll et al. |
| 8,355,194 B2 | 1/2013 | Granqvist |
| 8,410,712 B2 | 4/2013 | Schroder et al. |
| 8,415,657 B2 | 4/2013 | Rui et al. |
| 8,420,162 B2 | 4/2013 | Blacker et al. |
| 8,420,207 B2 | 4/2013 | Reutler et al. |
| 8,440,329 B2 | 5/2013 | Fleury et al. |
| 8,445,373 B2 | 5/2013 | Broadway et al. |
| 8,500,965 B2 | 8/2013 | Thiel |
| 8,518,221 B2 | 8/2013 | Krasnov |
| 8,524,337 B2 | 9/2013 | Lemmer et al. |
| 8,551,300 B2 | 10/2013 | Stachowiak |
| 8,557,642 B2 | 10/2013 | Schroder et al. |
| 8,580,355 B2 | 11/2013 | Durandeau et al. |
| 8,586,215 B2 | 11/2013 | Hartig |
| 8,658,262 B2 | 2/2014 | Myli et al. |
| 8,674,618 B2 | 3/2014 | Shroder et al. |
| 8,815,059 B2 | 8/2014 | McLean et al. |
| 8,834,976 B2 | 9/2014 | Lemmer et al. |
| 8,871,349 B2 | 10/2014 | Lemmer et al. |
| 8,907,258 B2 | 12/2014 | Schroder et al. |
| 8,939,606 B2 | 1/2015 | Maikowski et al. |
| 8,945,686 B2 | 2/2015 | Pope et al. |
| 9,006,047 B2 | 4/2015 | Schroder et al. |
| 9,011,649 B2 | 4/2015 | Kharchenko et al. |
| 9,028,956 B2 | 5/2015 | Knoll et al. |
| 9,052,456 B2 | 6/2015 | Hassan et al. |
| 9,073,781 B2 | 7/2015 | Nadaud et al. |
| 9,095,871 B2 | 8/2015 | Vogt et al. |
| 9,095,874 B2 | 8/2015 | Schroder et al. |
| 9,199,875 B2 | 12/2015 | Lemmer et al. |
| 9,237,637 B2 | 1/2016 | Rawson |
| 9,266,773 B2 | 2/2016 | Lemmer et al. |
| 9,469,566 B2 | 10/2016 | Myli et al. |
| 9,494,068 B2 | 11/2016 | Schroder et al. |
| 9,580,807 B2 | 2/2017 | Bilaine et al. |
| 9,599,397 B2 | 3/2017 | Jackson |
| 9,631,283 B2 | 4/2017 | Schroder et al. |
| 9,633,876 B2 | 4/2017 | Timans et al. |
| 9,643,208 B2 | 5/2017 | Schroder et al. |
| 9,745,792 B2 | 8/2017 | Myli et al. |
| 9,752,377 B2 | 9/2017 | Myli et al. |
| 9,862,640 B2 | 1/2018 | Pfaff et al. |
| 10,000,411 B2 | 6/2018 | Burrows et al. |
| 10,000,965 B2 | 6/2018 | Burrows et al. |
| 10,060,180 B2 | 8/2018 | Burrows et al. |
| 2001/0008710 A1 | 7/2001 | Takatsuji et al. |
| 2001/0016253 A1 | 8/2001 | Goda et al. |
| 2001/0044032 A1 | 11/2001 | Finley et al. |
| 2002/0004318 A1 | 1/2002 | Powell |
| 2002/0009601 A1 | 1/2002 | Stachowiak |
| 2002/0021495 A1 | 2/2002 | Lingle |
| 2002/0046993 A1 | 4/2002 | Peterson et al. |
| 2002/0071903 A1 | 6/2002 | Lee et al. |
| 2003/0003304 A1 | 1/2003 | Ohtsu et al. |
| 2003/0134122 A1 | 7/2003 | Wickboldt et al. |
| 2003/0155790 A1* | 8/2003 | Noguchi ............. B60S 1/0822 296/84.1 |
| 2003/0180547 A1 | 9/2003 | Buhay et al. |
| 2003/0190476 A1* | 10/2003 | Veerasamy ....... B32B 17/10036 428/408 |
| 2003/0198808 A1* | 10/2003 | Muromachi ........ C03C 17/3639 428/359 |
| 2004/0004684 A1 | 1/2004 | Yang et al. |
| 2004/0009356 A1 | 1/2004 | Medwick et al. |
| 2004/0028953 A1* | 2/2004 | Kraemling ........ B32B 17/10339 428/698 |
| 2004/0137235 A1 | 7/2004 | Paul et al. |
| 2004/0147139 A1 | 7/2004 | Jiang |
| 2004/0247929 A1 | 12/2004 | Buhay et al. |
| 2005/0000794 A1 | 1/2005 | Demaray et al. |
| 2005/0008796 A1* | 1/2005 | Kriltz ................. B32B 17/1033 428/34 |
| 2005/0133085 A1 | 6/2005 | Shimada |
| 2005/0238886 A1 | 10/2005 | Gallego |
| 2005/0258029 A1 | 11/2005 | Muller et al. |
| 2006/0011466 A1 | 1/2006 | Chen |
| 2006/0050425 A1* | 3/2006 | Muromachi ............ C03C 27/10 359/883 |
| 2006/0118408 A1 | 6/2006 | Myli et al. |
| 2006/0121315 A1 | 6/2006 | Myli et al. |
| 2006/0144695 A1 | 7/2006 | Lee et al. |
| 2006/0201203 A1 | 9/2006 | Labrousse et al. |
| 2006/0234064 A1 | 10/2006 | Baubet et al. |
| 2007/0029186 A1 | 2/2007 | Krasnov et al. |
| 2007/0029187 A1 | 2/2007 | Krasnov |
| 2007/0081227 A1 | 4/2007 | Hartig |
| 2007/0082124 A1 | 4/2007 | Hartig |
| 2007/0082169 A1 | 4/2007 | Hartig |
| 2007/0082186 A1 | 4/2007 | Hartig |
| 2007/0087492 A1 | 4/2007 | Yamanaka |
| 2007/0137999 A1 | 6/2007 | Delrue et al. |
| 2007/0138567 A1 | 6/2007 | Ito |
| 2007/0235662 A1 | 10/2007 | Tien et al. |
| 2007/0240977 A1 | 10/2007 | Krempel-Hesse et al. |
| 2007/0241364 A1 | 10/2007 | Akao et al. |
| 2007/0272664 A1 | 11/2007 | Schroder et al. |
| 2008/0006521 A1 | 1/2008 | Schroder et al. |
| 2008/0008829 A1 | 1/2008 | Blacker et al. |
| 2008/0099066 A1 | 5/2008 | Ito et al. |
| 2008/0115471 A1 | 5/2008 | Labrousse et al. |
| 2008/0160321 A1* | 7/2008 | Padiyath ........... B32B 17/10834 428/432 |
| 2008/0223718 A1 | 9/2008 | Takagi et al. |
| 2008/0261035 A1 | 10/2008 | Grimal et al. |
| 2008/0280078 A1 | 11/2008 | Krisko et al. |
| 2008/0292872 A1 | 11/2008 | Boire et al. |
| 2009/0020414 A1 | 1/2009 | Tsao et al. |
| 2009/0047509 A1 | 2/2009 | Gagliardi et al. |
| 2009/0053878 A1 | 2/2009 | Kelman et al. |
| 2009/0075069 A1 | 3/2009 | Myli et al. |
| 2009/0084438 A1* | 4/2009 | den Boer ........ H01L 31/022466 136/256 |
| 2009/0135319 A1* | 5/2009 | Veerasamy ....... B32B 17/10055 349/16 |
| 2009/0169846 A1 | 7/2009 | Siddle et al. |
| 2009/0176086 A1 | 7/2009 | Martin et al. |
| 2009/0180766 A1 | 7/2009 | Kusuda |
| 2009/0214880 A1 | 8/2009 | Lemmer |
| 2009/0229856 A1 | 9/2009 | Fredenberg et al. |
| 2009/0297886 A1 | 12/2009 | Gessert et al. |
| 2009/0320824 A1* | 12/2009 | Henn .................. C03C 17/3686 126/500 |
| 2010/0035030 A1 | 2/2010 | Huang et al. |

(56) References Cited

U.S. PATENT DOCUMENTS

| | | |
|---|---|---|
| 2010/0062245 A1 | 3/2010 | Martin et al. |
| 2010/0071810 A1 | 3/2010 | Nadaud et al. |
| 2010/0098874 A1 | 4/2010 | Schroder |
| 2010/0118407 A1 | 5/2010 | Huff |
| 2011/0023959 A1 | 2/2011 | Yoo et al. |
| 2011/0094577 A1 | 4/2011 | Chatterjee et al. |
| 2011/0108108 A1 | 5/2011 | Im et al. |
| 2011/0146785 A1 | 6/2011 | Buller et al. |
| 2011/0171365 A1 | 7/2011 | Kuroda |
| 2011/0180130 A1* | 7/2011 | Krasnov ............ H01L 31/1884 136/256 |
| 2011/0210656 A1 | 9/2011 | Lemmer et al. |
| 2011/0212279 A1 | 9/2011 | Lemmer et al. |
| 2011/0212311 A1* | 9/2011 | Lemmer ............... B60J 1/2094 428/212 |
| 2011/0216389 A1* | 9/2011 | Piroux ................ G02F 1/15165 359/268 |
| 2011/0247851 A1 | 10/2011 | Jackson et al. |
| 2011/0262657 A1 | 10/2011 | Pope et al. |
| 2011/0312120 A1 | 12/2011 | Weiner et al. |
| 2012/0021149 A1* | 1/2012 | Myli ................... C03C 17/3411 428/34 |
| 2012/0048722 A1* | 3/2012 | McLean ............. C03C 17/3435 204/192.1 |
| 2012/0073640 A1 | 3/2012 | Daniel et al. |
| 2012/0087005 A1 | 4/2012 | Reymond et al. |
| 2012/0094075 A1 | 4/2012 | Peter et al. |
| 2012/0097222 A1 | 4/2012 | Gessert et al. |
| 2012/0100665 A1 | 4/2012 | Li et al. |
| 2012/0107554 A1 | 5/2012 | Pfaff et al. |
| 2012/0107587 A1 | 5/2012 | Martin et al. |
| 2012/0164420 A1 | 6/2012 | Lemmer et al. |
| 2012/0227798 A1 | 9/2012 | Pan et al. |
| 2012/0241316 A1 | 9/2012 | Arakawa |
| 2012/0252207 A1 | 10/2012 | Lei et al. |
| 2012/0255192 A1 | 10/2012 | Schroder et al. |
| 2012/0260851 A1 | 10/2012 | Yoo et al. |
| 2013/0032477 A1 | 2/2013 | Yamakoshi et al. |
| 2013/0037913 A1 | 2/2013 | Chen et al. |
| 2013/0095292 A1 | 4/2013 | Pfaff et al. |
| 2013/0112258 A1 | 5/2013 | Park et al. |
| 2013/0114133 A1 | 5/2013 | Sado et al. |
| 2013/0118565 A1 | 5/2013 | Abou-Kandil et al. |
| 2013/0120842 A1 | 5/2013 | Moens et al. |
| 2013/0153015 A1 | 6/2013 | Lee et al. |
| 2013/0199608 A1 | 8/2013 | Emeraud |
| 2013/0267060 A1 | 10/2013 | Dauson et al. |
| 2013/0320241 A1 | 12/2013 | Krasnov et al. |
| 2014/0010976 A1* | 1/2014 | Gerardin ........... B32B 17/10761 428/34 |
| 2014/0017857 A1 | 1/2014 | Schroder et al. |
| 2014/0154427 A1 | 6/2014 | Edd et al. |
| 2014/0154434 A1 | 6/2014 | Nunez-Regueiro et al. |
| 2014/0176836 A1* | 6/2014 | Brecht ............. G02F 1/133553 349/16 |
| 2014/0237917 A1* | 8/2014 | Theios ................. C03C 17/366 52/203 |
| 2014/0268316 A1 | 9/2014 | Zhang et al. |
| 2014/0272454 A1 | 9/2014 | Zhang et al. |
| 2014/0272465 A1 | 9/2014 | Lienhart et al. |
| 2014/0334805 A1 | 11/2014 | McLean et al. |
| 2015/0004369 A1* | 1/2015 | Eby .................. B32B 17/10229 428/174 |
| 2015/0055943 A1 | 2/2015 | Schroder et al. |
| 2015/0070755 A1* | 3/2015 | Singh ................. C03C 17/3649 359/359 |
| 2015/0072084 A1 | 3/2015 | Mimoun et al. |
| 2015/0124447 A1 | 5/2015 | Maikowski et al. |
| 2015/0140355 A1 | 5/2015 | Suzuki et al. |
| 2015/0146286 A1 | 5/2015 | Hagen et al. |
| 2015/0176133 A1 | 6/2015 | Pope et al. |
| 2015/0311092 A1 | 10/2015 | Schroder et al. |
| 2016/0002098 A1* | 1/2016 | Sternchuss .......... B32B 17/1077 428/216 |
| 2016/0002100 A1* | 1/2016 | Melcher .............. C03C 17/3649 428/216 |
| 2016/0060948 A1* | 3/2016 | Burrows ............... E06B 3/6612 428/34 |
| 2016/0229741 A1 | 8/2016 | Canova et al. |
| 2016/0272537 A1* | 9/2016 | Myli ....................... C03C 17/36 |
| 2016/0273264 A1* | 9/2016 | Myli .................. C03C 17/3644 |
| 2016/0273265 A1* | 9/2016 | Myli ........................ E06B 3/66 |
| 2018/0237899 A1* | 8/2018 | Lu ....................... C23C 14/0652 |
| 2018/0312428 A1* | 11/2018 | Vandal .................... C03C 3/087 |

FOREIGN PATENT DOCUMENTS

| | | |
|---|---|---|
| EP | 1765740 A1 | 3/2007 |
| GB | 718189 A | 11/1954 |
| GB | 1498142 A | 1/1978 |
| JP | H11-262968 A | 9/1999 |
| WO | 92017412 A1 | 10/1992 |
| WO | 03093185 A1 | 11/2003 |
| WO | 2006110217 A2 | 10/2006 |
| WO | 2009036284 A1 | 3/2009 |
| WO | 2010115558 A1 | 10/2010 |
| WO | 2011039488 A1 | 4/2011 |
| WO | 2011105991 A1 | 9/2011 |
| WO | 2012078395 A2 | 6/2012 |
| WO | 2012115850 A1 | 8/2012 |
| WO | 2014017448 A1 | 1/2014 |
| WO | 2014109368 A1 | 7/2014 |
| WO | 2014164989 A1 | 10/2014 |
| WO | 2014185420 A1 | 11/2014 |
| WO | 2015055944 A1 | 4/2015 |
| WO | 2015197969 A1 | 12/2015 |

OTHER PUBLICATIONS

Davis, "Properties of transparent conducting oxides deposited at room temperature," Thin Solid Films, vol. 236, No. 1-2, Dec. 15, 1993, pp. 1-5.

Gordon, "Criteria for Choosing Transparent Conductors," MRS Bulletin, Aug. 2000, pp. 52-57.

Junghahnel et al., "P-65: Advanced processing of ITO and IZO thin films on flexible glass," Society for Information Display, vol. 46, No. 1, May 21-Jun. 5, 2015, pp. 1378-1381.

Mitsui et al., "Optical and Electrical Properties of SiO2-Overcoated ITO Films for Automotive Windows," Asahi Glass Research Reports, Asahi Glass Co., Ltd., vol. 54, 2004, pp. 11-15.

Sebastien et al., International Patent Application No. PCT/FR2015/051671, entitled Anti-Condensation Glazing Unit, filed Jun. 23, 2015, English Machine Translation, 19 pages.

Unknown, "Large area transparent and conductive metal oxide thin films on glass made with an intermediate temperature post-deposition heat treatment in air," Defensive Publication Serial No. 000242912, retrieved from <http://ip.com/IPCOM/00242912>, Aug. 28, 2015, 3 pages.

Partial English translation of International Patent Publication WO 2014/109368, published Jul. 17, 2014, 6 pages.

Machine translation of International Patent Publication WO 2014/109368, published Jul. 17, 2014, 8 pages.

U.S. Appl. No. 16/740,006, "Alloy Oxide Overcoat Indium Tin Oxide Coatings, Coated Glazings, and Production Methods," filed Jan. 10, 2020, 48 pages, identified hereby as being a related application.

Pre-Filing Activity Disclosure Form for disclosures believed to have occurred more than one year prior to filing the instant application, Cardinal CG Company, 3 pgs.

International Pat. App. No. PCT/US2019/058774, Invitation to Pay Additional Fees and Partial Search Report dated Feb. 26, 2020, 9 pages.

International Pat. App. No. PCT/US2019/058774, International Search Report and Written Opinion dated May 14, 2020, 16 pages.

\* cited by examiner

LOW SOLAR HEAT GAIN COATINGS, LAMINATED GLASS ASSEMBLIES, AND METHODS OF PRODUCING SAME

FIELD OF THE INVENTION

The present invention relates to thin film coatings for glass panes. In particular, this invention relates to low solar heat gain coatings based on indium tin oxide. Also provided are laminated glass assemblies that include such a coating.

BACKGROUND OF THE INVENTION

A variety of advantageous transparent electrically conductive oxide (TCO) coatings are known in the art. Commonly, these coatings include an indium tin oxide film. In some cases, the indium tin oxide film is located beneath an overcoat film of silicon nitride, silicon oxynitride, or silicon dioxide.

As is well known, the solar heat gain coefficient (SHGC) of a window is the fraction of incident solar radiation that is admitted through a window. There are a number of applications where low solar heat gain windows are of particular benefit. In warm climates, it is desirable to have low solar heat gain windows. For example, solar heat gain coefficients of about 0.45 and below are generally recommended for buildings in the southern United States. Similarly, windows that are exposed to a lot of sun preferably have a low solar heat gain coefficient. Windows on the east or west side of a building, for example, tend to get a lot of sun in the morning or afternoon. Of course, sunrooms, solariums, and greenhouses also get a great deal of sun. For applications like these, the solar heat gain coefficient of a window plays a role in maintaining a comfortable environment within the building. Thus, it is beneficial to provide windows of this nature with coatings that establish a low solar heat gain coefficient (i.e., "low solar heat gain coatings").

A tradeoff is sometimes made in low solar heat gain coatings whereby the films selected to achieve a low SHGC have the effect of restricting the visible reflectance to a higher level than is ideal. As a consequence, windows bearing these coatings may have a somewhat mirror-like appearance. It would be desirable to provide a low solar heat gain coating that has sufficiently low visible reflectance to obviate this mirror-like appearance problem, and ideally has exceptional visible reflectance properties.

In addition to having undesirably high visible reflection, the reflected colors of certain low solar heat gain coatings are not ideal. For example, some coatings exhibit hues that are more red and/or yellow than is desired. Additionally or alternatively, the chroma of these coatings may be greater than is desired. In most cases, it is preferable to provide a coating that is as color neutral (i.e., colorless) as possible. Thus, the reflected colors of certain low solar heat gain coatings may be less than ideal, both in terms of hue and chroma.

It would be desirable to provide a low solar heat gain coating based on ITO that has low visible transmission and low visible reflection. It would be particularly desirable to provide such a coating where both the interior and exterior visible reflections are low. Further, it would be desirable to provide a low solar heat gain coating that exhibits a neutral (e.g., grey) color in reflection. Still further, it would be desirable to provide laminated glass panels that include at least a low solar heat gain coating of this nature, optionally together with a low-emissivity coating. In some cases, it would be particularly desirable to provide a laminated glass panel having both a low solar heat gain coating of the nature described and a low-emissivity coating comprising three silver-containing films.

SUMMARY OF THE INVENTION

Certain embodiments provide a coated glass pane having a surface that bears a coating. In the present embodiments, the coating comprises, in sequence moving outwardly from the surface, a first indium tin oxide film, a first nickel compound film, a second indium tin oxide film, a second nickel compound film, and an overcoat layer. Preferably, the first indium tin oxide film has a thickness of between 480 Å and 725 Å, the first nickel compound film has a thickness of between 80 Å and 120 Å, the second indium tin oxide film has a thickness of between 580 Å and 870 Å, and the second nickel compound film has a thickness of between 65 Å and 100 Å.

In some embodiments, the invention provides a laminated glass panel including two glass panes and an interlayer. The interlayer is sandwiched between the two glass panes and bonded thereto. At least one of the two glass panes has an interior surface that bears a coating. In the present embodiments, the coating comprises, in sequence moving away from the noted interior surface and toward the interlayer, a first indium tin oxide film, a first nickel-aluminum film, a second indium tin oxide film, a second nickel-aluminum film, and an overcoat layer. Preferably, the first indium tin oxide film has a thickness of between 480 Å and 725 Å, the first nickel-aluminum film has a thickness of between 80 Å and 120 Å, the second indium tin oxide film has a thickness of between 580 Å and 870 Å, and the second nickel-aluminum film has a thickness of between 65 Å and 100 Å.

Some embodiments of the invention provide a laminated glass panel including first and second glass panes and an interlayer. At least one of the two glass panes has an interior surface that bears an ITO-based coating. The interlayer is sandwiched between the first and second glass panes. In the present embodiments, the laminated glass panel has an exterior reflected color characterized by a chroma magnitude number of less than 1.

Certain embodiments provide a laminated glass panel including first and second glass panes and an interlayer. The interlayer is sandwiched between the first and second glass panes. The first pane has an interior surface facing the interlayer. The second pane has an interior surface facing the interlayer. In the present embodiments, the interior surface of the first pane bears an ITO-based coating, and the interior surface of the second pane bears a low-emissivity coating comprising three silver layers.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Many embodiments of the invention involve a coated substrate. A variety of substrate types are suitable for use in the invention. In some embodiments, the substrate 10 is a sheet-like substrate having generally opposed first and second major surfaces. For example, the substrate 10 can be a sheet of transparent material (i.e., a transparent sheet). The substrate, however, is not required to be a sheet, nor is it required to be transparent.

For many applications, the substrate 10 will comprise a transparent (or at least translucent) material, such as glass or clear plastic. For example, the substrate 10 is a glass pane (e.g., a window pane) in certain embodiments. In any embodiment of the present disclosure, the (or each) substrate can optionally be a glass pane. A variety of known glass types can be used, such as soda-lime glass. In some cases, it may be desirable to use "white glass," a low iron glass, etc. In certain embodiments, the substrate is part of a window, door, skylight, or other glazing. Depending on the level of solar control desired, the present coating may be applied to tinted glass. Thus, the low solar heat gain coating 50 of any embodiment disclosed herein can optionally be provided on a sheet of tinted glass.

Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

Substrates of various thicknesses can be used in the present invention. In some embodiments, the substrate 10 (which can optionally be a glass pane) has a thickness of about 1-8 mm. Certain embodiments involve a substrate with a thickness of between about 2.3 mm and about 4.8 mm, and perhaps more preferably between about 2.5 mm and about 4.8 mm. In one particular embodiment, a glass pane (e.g., soda-lime glass) with a thickness of about 3 mm is used.

The substrate 10 has opposed surfaces 16 and 18, which preferably are opposed major surfaces (or "opposed faces"). In some cases, surface 16 is destined to be an interior surface in contact with an interlayer of a laminated glass panel, while surface 18 is destined to be an exterior surface exposed to an outdoor environment (and thus exposed to periodic contact with rain). This, however, will not be the case in all embodiments.

Figure 1:
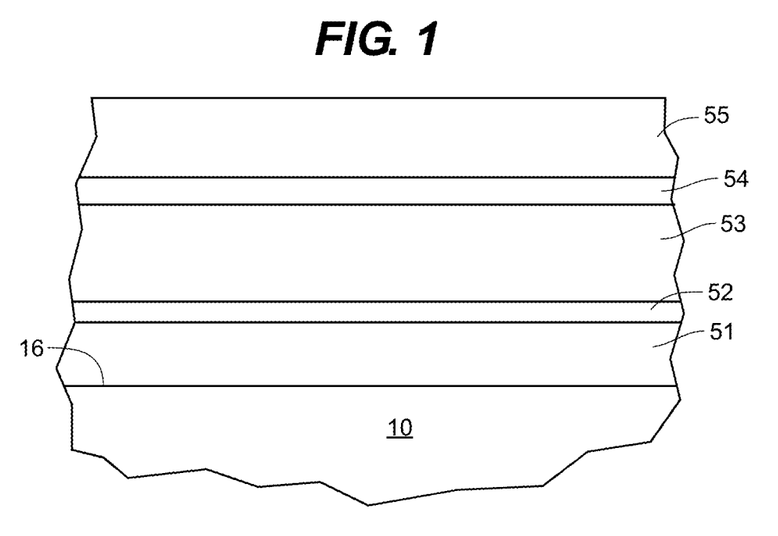
FIG. 1 is a broken-away schematic cross-sectional view of a substrate with a surface bearing a low solar heat gain coating in accordance with certain embodiments of the present invention.

As shown in FIG. 1, the substrate 10 bears a low solar heat gain coating 50. In FIG. 1, the coating 50 includes, in sequence moving away from surface 16, a first indium tin oxide film 51, a first nickel compound film 52, a second indium tin oxide film 53, a second nickel compound film 54, and an overcoat layer 55. The films can be provided in the form of discrete layers, thicknesses of graded film, or a combination of both including at least one discrete layer and at least one thickness of graded film. In some cases, all the films of the coating 50 are sputtered films.

The indium tin oxide films 51, 53 both comprise (i.e., include) indium tin oxide. Each of these films can optionally comprise indium tin oxide together with one or more other materials. If desired, zinc, aluminum, antimony, fluorine, carbon nanotubes, or other additives can be included in the film. Preferably, the indium tin oxide film consists essentially of, or consists of, indium tin oxide. Each indium tin oxide film 51, 53 can contain various relative percentages of indium oxide and tin oxide. Indium oxide is the major constituent. That is, it accounts for more than 50% of the film's total weight. Preferably, the composition of the film ranges from about 75% indium oxide/25% tin oxide to about 95% indium oxide/5% tin oxide, such as about 90% indium oxide/10% tin oxide.

In FIG. 1, the first indium tin oxide film 51 is deposited over surface 16 of substrate 10. The indium tin oxide film 51, as deposited, is a sub-oxide (i.e., its oxygen content is substoichiometric). Preferably, the deposition method involves sputtering a metallic indium tin target in an oxidizing atmosphere. Thus, each indium tin oxide film 51, 53 can optionally be an ITO film characterized by having been sputter deposited from one or more metallic indium tin targets in an oxidizing atmosphere. The deposition technique can be, for example, in accordance with any non-limiting sputter deposition example described below.

Preferably, the first indium tin oxide film 20 is directly on (i.e., in contact with) surface 16 of the substrate 10. If desired, however, there can be a base film (e.g., silicon dioxide, silicon nitride, or silicon oxynitride, optionally with a small amount of aluminum or other dopant) between the substrate 10 and the first indium tin oxide film 51. Moreover, when provided, such a base film may comprise two or more layers, e.g., a first layer comprising silicon and a second layer comprising tin. In one non-limiting example, the first layer comprises silicon dioxide, silicon nitride, and/or silicon oxynitride while the second layer comprises tin oxide.

The first indium tin oxide film 51 preferably has a thickness of between 400 Å and 900 Å. In certain embodiments, the first indium tin oxide film 51 has a thickness of between 480 Å and 725 Å, such as about 505 Å, or between 540 Å and 660 Å, such as about 600 Å. For any embodiment of the present disclosure, the first indium tin oxide film 51 can optionally have a thickness in any one or more (e.g., all three) of the ranges noted in this paragraph. The thicknesses recited herein are physical thicknesses unless otherwise specified to be optical thicknesses.

With respect to the two nickel compound films 52, 54, each comprises an alloy or other compound including nickel and at least one other metal. Preferably, the nickel compound film comprises nickel aluminum. Another option is nickel titanium. Still another option is nickel chromium. Yet another option is nickel aluminum titanium. A further option is nickel titanium niobium. Other compounds comprising nickel and at least one other metal can also be used.

In some cases, each of the two nickel compound films 52, 54 comprises oxygen. For example, an upper thickness of the nickel compound film may comprise oxide film (optionally fully oxidized film) while a lower thickness is metallic or substoichiometric. In certain preferred embodiments, each nickel compound film 52, 54 is deposited as metallic film. In some cases, the first nickel compound film 52 comprises nickel, aluminum, and oxygen, and the second nickel compound film 54 comprises nickel, aluminum, and nitrogen. In certain embodiments, each nickel compound film 52, 54 comprises, consists essentially of, or consists of, nickel, aluminum, and oxygen.

The first nickel compound film 52 preferably has a thickness of between 50 Å and 200 Å. In certain embodiments, the first nickel compound film 52 has a thickness of between 80 Å and 120 Å, such as 90 Å, or between 90 Å and 110 Å, such as 100 Å. For any embodiment of the present disclosure, the first nickel compound film 52 can optionally have a thickness in any one or more (e.g., all three) of the ranges noted in this paragraph.

The first nickel compound film 52 is formed over the first indium tin oxide film 51. In some cases, the first nickel compound film 52 is deposited as a metallic (i.e., elemental metal) film. Such film can be sputtered, for example from one or more metallic compound (e.g., alloy) targets, onto the first indium tin oxide film 51 in an inert atmosphere (e.g., argon). If desired, one or more nickel alloy (e.g., Ni—Al) targets can be used. Alternatively, a first metallic target (optionally comprising Al) can be co-sputtered with a nickel alloy target. The thus coated substrate may then be conveyed into a subsequent oxygen-containing sputtering zone, e.g., where the second indium tin oxide film 53 is deposited onto the first nickel compound film 52. As a result of this exposure, the nickel compound film will typically become at least partially oxidized. Preferably, an outer portion of this film (or at least a metal therein, such as aluminum when present) will become oxidized, while an inner portion (or at least nickel therein) remains metallic. Providing metallic nickel in the inner portion can impart absorption of visible radiation, thus facilitating good control over visible transmission, reflection, and color. This is particularly advantageous for providing the coating with low levels of visible transmission and reflection.

In certain embodiments, each nickel compound film 52, 54 is deposited as a sub-oxide (i.e., substoichiometric) film. If desired, the nickel compound film, as deposited, can be substoichiometric across the entire thickness of the film. In some cases, a sub-oxide nickel compound film is deposited by sputtering one or more sub-oxide targets containing nickel and at least one other metal (such as Al) onto the first indium tin oxide film 51 in an inert atmosphere. If desired, some oxygen, nitrogen, or both can be used in the sputtering atmosphere, but in an amount small enough to deposit the film as a sub-oxide. When provided, the sub-oxide target(s) can optionally further include titanium sub-oxide, e.g., $TiO_x$, where x is less than 2. In other cases, a sub-oxide nickel compound film is deposited by sputtering one or more nickel alloy targets onto the first indium tin oxide film 51 in an oxidizing atmosphere wherein the amount and/or reactivity of oxygen is controlled to deposit the film as a sub-oxide. In still other cases, separate targets of different compositions are co-sputtered in a sub-oxidizing atmosphere (wherein the amount and/or reactivity of oxygen are controlled to deposit the film as a sub-oxide). If desired, one or each of the co-sputtered targets may include titanium. Regardless of which deposition method is used, the thus coated substrate may then be conveyed into a subsequent oxygen-containing sputtering zone (e.g., where a subsequent indium tin oxide film 53 is deposited onto the sub-oxide nickel alloy film). As a result of this exposure, the sub-oxide film will become further oxidized. Preferably, an outer portion of this layer (or at least a metal therein, such as aluminum when present) will become more oxidized (optionally fully oxidized), while an inner portion (or at least nickel therein) remains less oxidized (e.g., substoichiometric).

It has been discovered that the combination of nickel and aluminum, as used in certain embodiments, can provide particularly good durability and color properties. This can be especially advantageous for laminated glass embodiments (where both the ITO-based coating and a polymer interlayer are sandwiched between two glass panes, such that there is no air space between the two panes).

It is to be understood that the term "nickel compound," as used herein, refers to any compound that includes at least some nickel and at least one other metal. The term "nickel alloy," as used herein, refers to any alloy or other metallic mixture that includes at least some nickel and at least one other metal. The term "nickel aluminum" is used herein to refer to any compound that includes at least some nickel and at least some aluminum. Included in this definition is any compound comprising both nickel and aluminum, whether in metallic (i.e., elemental metal) form or in the form of an oxide, a nitride, an oxynitride, etc., and optionally including one or more other desired materials.

In some embodiments, nickel and aluminum are the only metals dispersed along the entire thickness of each nickel compound film 52, 54. For example, each nickel compound film 52, 54 can optionally be free of (i.e., devoid of) metals other than nickel and aluminum. If desired, the nickel aluminum can consist essentially of nickel and aluminum, optionally together with oxygen, nitrogen, or both. The discussion in this paragraph applies for each nickel compound film in the coating.

Preferably, each nickel compound film 52, 54 contains (and/or is deposited as film containing) more than 7.5% aluminum by weight. Additionally or alternatively, the film can optionally contain (and/or be deposited as film containing) less than 30% aluminum by weight. Thus, the nickel compound film can advantageously contain (and/or be deposited as film containing) aluminum at a weight percentage of between 7.5% and 30%, such as between 7.5% and 25%, or between 7.5% and 15%, e.g., about 10%, with the remainder optionally being nickel. In one embodiment, each nickel compound film 52, 54 is deposited as film containing about 90% nickel and about 10% aluminum. In embodiments where the nickel compound film comprises oxygen, nitrogen, or both, the foregoing percentages are on a metal-only basis. The discussion in this paragraph applies for each nickel compound film in the coating.

In some cases, one or each nickel compound film 52, 54 comprises nickel, aluminum, and titanium. In such cases, the relative amounts of nickel, aluminum, and titanium can be varied depending upon the particular application, the properties desired, etc. When provided, titanium can be present in the film in metallic form, stoichiometric oxide form, and/or sub-oxide form.

In preferred embodiments, the first nickel compound film 52 is in contact with both the first indium tin oxide film 51 and the second indium tin oxide film 53. This can be appreciated, for example, by referring to FIG. 1. Thus, in FIG. 1, the second indium tin oxide film 53 is directly on the first nickel compound film 52. In other cases, a transparent dielectric film may be provided between the first nickel compound film 52 and the second indium tin oxide film 53.

The second indium tin oxide film 53 preferably has a thickness of between 400 Å and 1,000 Å. In preferred embodiments, the second indium tin oxide film 53 has a thickness of between 580 Å and 870 Å, or between 650 Å and 800 Å, such as 725 Å or 735 Å. For any embodiment of the present disclosure, the second indium tin oxide film 53 can optionally have a thickness in any one or more (e.g., all three) of the ranges noted in this paragraph.

In some cases, the second indium tin oxide film 53 is thicker than the first indium tin oxide film 51. This can optionally be the case in combination with the two indium tin oxide films 51, 53 having thicknesses within any one or more (e.g., all three) of the ranges noted above for each indium tin oxide film. The second indium tin oxide film 53 can optionally be thicker than the first indium tin oxide film 51 by at least 50 Å, at least 100 Å, at least 150 Å, or at least 200 Å. It is to be appreciated, however, that this is by no means required. Instead, the two indium tin oxide films 51, 53 can have the same thickness, or the first 51 can be thicker than the second 53.

The second nickel compound film 54 is formed over the second indium tin oxide film 53. Preferably, the second nickel compound film 54 is in contact with the second indium tin oxide film 53. The second nickel compound film 54 can have any composition, and can be formed using any deposition method, described above for the first nickel compound film 52.

The second nickel compound film 54 preferably has a thickness of between 50 Å and 200 Å. In certain embodiments, the second nickel alloy film 54 has a thickness of between 65 Å and 100 Å, or between 70 Å and 95 Å, such as 85 Å or 90 Å. For any embodiment of the present disclosure, the second nickel compound film 54 can optionally have a thickness in any one or more (e.g., all three) of the ranges noted in this paragraph.

In some embodiments, the first nickel compound film 52 is thicker than the second nickel compound film 54. This can optionally be the case in combination with the two nickel compound films 52, 54 having thicknesses within any one or more (e.g., all three) of the ranges noted above for each nickel compound film. In other embodiments, the first and second nickel compound films 52, 54 have the same thickness.

In some cases, the second nickel compound film 54 is deposited as a metallic (i.e., elemental metal) film. Such film can be sputtered, for example from one or more metallic compound (e.g., alloy) targets, onto the second indium tin oxide film 53 in an inert atmosphere (e.g., argon). If desired, one or more nickel alloy (e.g., Ni—Al) targets can be used. Alternatively, a first metallic target (optionally comprising Al) can be co-sputtered with a nickel alloy target. The thus coated substrate may then be conveyed into a subsequent oxygen-containing sputtering zone, e.g., where the overcoat layer 55 is deposited onto the second nickel compound film 54. As a result of this exposure, the nickel compound film will typically become at least partially oxidized, nitrided, or oxynitrided. Preferably, an outer portion of this film (or at least a metal therein, such as aluminum when present) will become oxidized, nitrided, or oxynitrided, while an inner portion (or at least nickel therein) remains metallic. Providing metallic nickel in the inner portion can impart absorption of visible radiation, thus facilitating good control over visible transmission, reflection, and color. This is particularly advantageous for providing the coating with low levels of visible transmission and reflection.

For any embodiment of the present disclosure, the thicknesses of the first indium tin oxide film 51, the first nickel compound film 52, the second indium tin oxide film 53, and the second nickel compound film 54 preferably are all within the first range (i.e., the broadest range) noted above for each such film, more preferably are all within the second range (i.e., the intermediate range) noted above for each such film, and perhaps optimally are all within the third range (i.e., the narrowest range) noted above for each such film. These preferred thickness ranges help establish low visible transmission, exceptional reflection properties, and good color properties.

The overcoat layer 55 is formed over the second nickel compound film 54. Preferably, the overcoat layer 55 is in contact with the second nickel compound film 54. The overcoat layer preferably comprises a transparent dielectric material. In certain embodiments, the overcoat layer comprises (e.g., consists essentially of) silicon dioxide, silicon nitride, and/or silicon oxynitride, optionally together with a small amount of aluminum or another dopant. In other cases, the overcoat layer comprises (e.g., consists essentially of) tin oxide. The overcoat layer 55 preferably is the outermost film of the coating 50.

The overcoat layer 55 preferably has a thickness of between 400 Å and 1,000 Å. In certain embodiments, the overcoat layer 55 has a thickness of between 530 Å and 800 Å, or between 600 Å and 720 Å, such as 660 Å. For any embodiment of the present disclosure, the overcoat layer 55 can optionally have a thickness in any one or more (e.g., all three) of the ranges noted in this paragraph. The overcoat layer and the preferred thickness ranges noted in this paragraph help establish exceptional color properties.

For any embodiment of the present disclosure, the thicknesses for the first indium tin oxide film 51, the first nickel compound film 52, the second indium tin oxide film 53, the second nickel compound film 54, and the overcoat layer 55 preferably are all within the first range (i.e., the broadest range) noted above for each such film, more preferably are all within the second range (i.e., the intermediate range) noted above for each such film, and perhaps optimally are all within the third range (i.e., the narrowest range) noted above for each such film.

Tables 1 and 2 below show two non-limiting layer stacks that can be used as the low solar heat gain coating 50. In Table 1, the SiAlON film is the outermost film of the coating. In Table 2, the SiAlN film is the outermost film of the coating.

TABLE 1

Layer Stack 1

| FILM | THICKNESS |
|---|---|
| ITO | 600 Å |
| NiAl | 100 Å |
| ITO | 725 Å |
| NiAl | 85 Å |
| SiAlON | 660 Å |

TABLE 2

Layer Stack 2

| FILM | THICKNESS |
|---|---|
| ITO | 505 Å |
| NiAl | 90 Å |
| ITO | 735 Å |
| NiAl | 90 Å |
| SiAlN | 660 Å |

The layer stacks of Tables 1 and 2 are representative of embodiments wherein the second indium tin oxide film 53 is at least 50 Å thicker, at least 100 Å thicker, at least 150 Å thicker, or at least 200 Å thicker than the first indium tin oxide film 51. This can optionally be the case for any embodiment of the present disclosure. In some embodiments, this relative thickness arrangement is provided for the two indium tin oxide films 51, 53 in combination with having the thicknesses for the first indium tin oxide film 51, the first nickel compound film 52, the second indium tin oxide film 53, the second nickel compound film 54, and the overcoat layer 55 all be within the first range (i.e., the broadest range) noted above for each such film, more preferably within the second range (i.e., the intermediate range) noted above for each such film, and perhaps optimally within the third range (i.e., the narrowest range) noted above for each such film.

With respect to the layer stack of Table 1, this is representative of embodiments wherein the first nickel compound film 52 is at least 10 Å thicker than the second nickel compound film 54. In such embodiments, the thicknesses noted in the preceding paragraph can optionally be used.

In some cases, the substrate 10 is heated prior to film deposition, during deposition, or both. Additionally or alternatively, the coated substrate 10 can be heat treated after being coated. If desired, post-deposition heat treatment (such as glass tempering) can be performed in air. When the coated substrate 10 is heat treated, defects in the ITO can be healed and improvement of crystalline structure can occur in the indium tin oxide films 51, 53 without an uncontrollable change in their chemistry. The nickel compound films 52, 54 may provide resistance to oxygen reaching and reacting with the indium tin oxide films 51, 53 during heat treatment.

In certain embodiments, the low solar heat gain coating 50 is on a glass pane, and this coated glass pane is heat treated through a process that leaves the coated glass cut-able by conventional glass cutting techniques. The heat treatment, for example, can involve using lower temperature for conversion so as to maintain the stress in the glass such that the coated glass remains cut-able even after the heat treatment. One non-limiting example of such a heat treatment process is any of the flash-treatment processes described in U.S. Pat. Nos. 10,000,411 and 10,000,965 and 10,060,180, the teachings of which concerning flash-treatment processes are hereby incorporated herein by reference.

Figure 2:
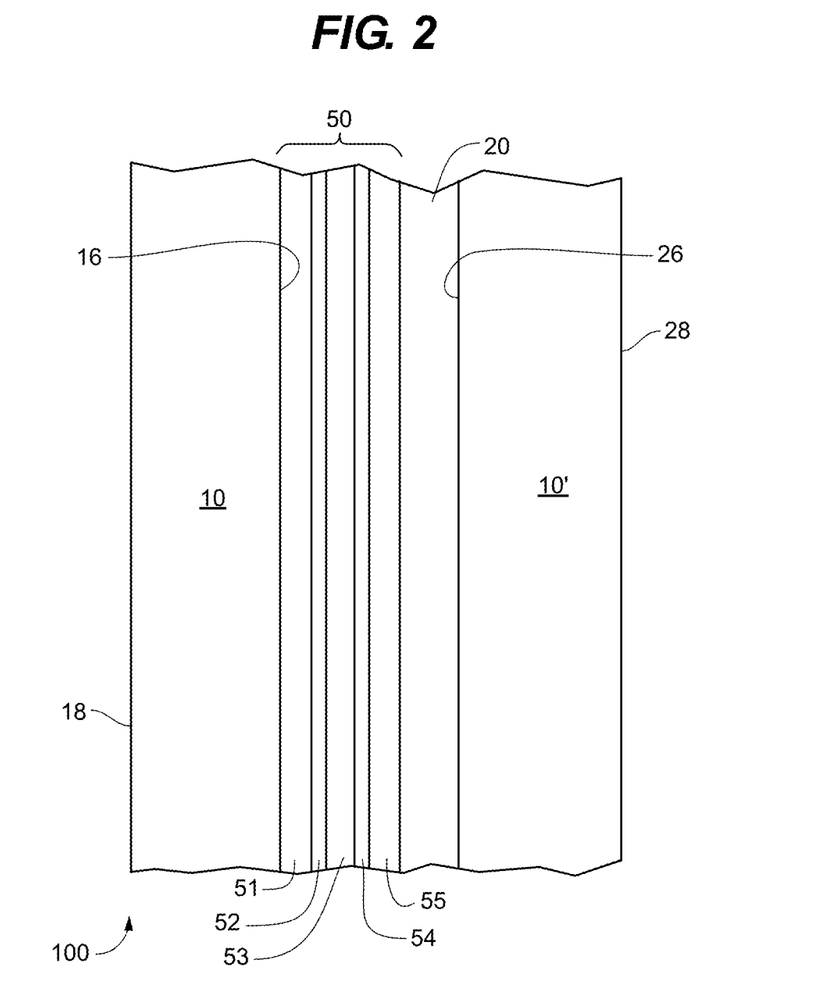
FIG. 2 is a broken-away schematic cross-sectional view of a laminated glass panel in accordance with certain embodiments of the invention.
Figure 3:
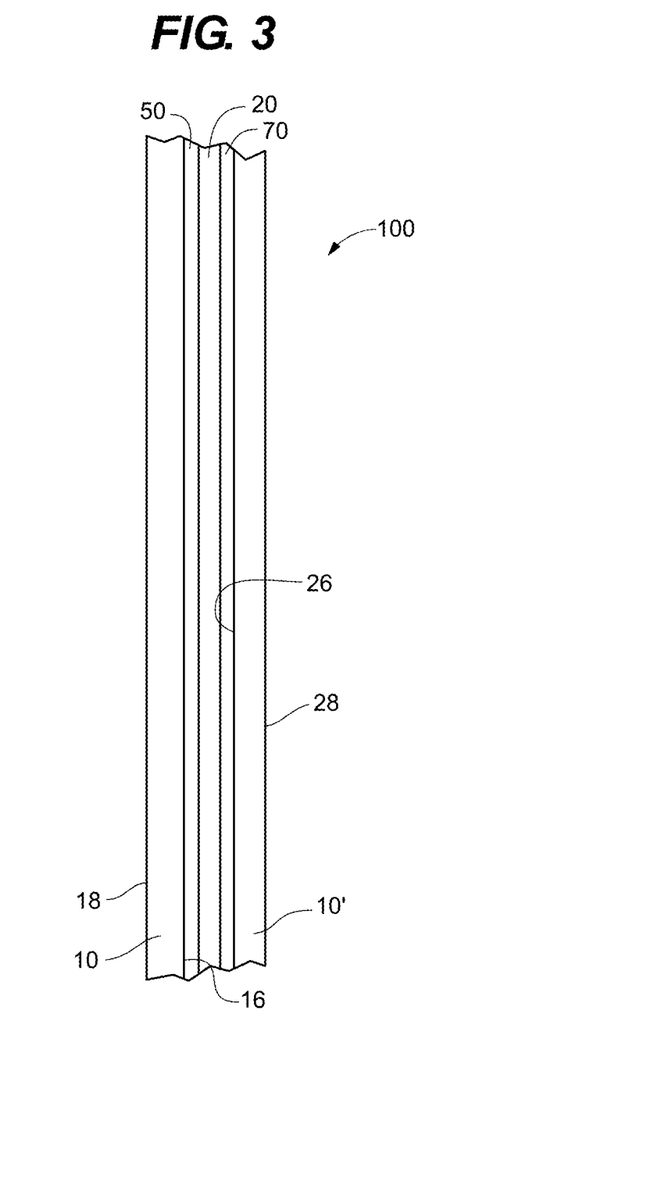
FIG. 3 is a broken-away schematic cross-sectional view of a laminated glass panel in accordance with other embodiments of the invention.

In certain embodiments, the invention provides a monolithic coated glass pane 10. Reference is made to FIG. 1. In other embodiments, the coated glass pane 10 is part of a laminated glass panel 100 that comprises at least two glass panes 10, 10' and an interlayer 20. Reference is made to FIGS. 2 and 3. While the present discussions focus on the substrate 10, or each substrate 10, 10', being a glass pane, other substrate types (including those described above) can alternatively be used.

The interlayer 20 preferably is a tear-resistant polymer layer. In some cases, it is a sheet of ionoplast plastic. In other cases, it is a sheet of polyvinylbutyral (PVB). Various other materials known to be suitable for the interlayer of a laminated glass panel can also be used.

In many cases, a laminated glass panel is produced through two operations: (1) an assembly operation, and (2) an autoclave operation. In the assembly operation, the interlayer is positioned between two glass substrates to form a sandwich, which is then heated (commonly to a temperature of between about 120° F. and about 170° F.) and roller pressed to initiate removal of air trapped between the interlayer and to initiate adhesion of the interlayer to the glass. In the autoclave operation, the sandwich is exposed to an elevated temperature (commonly between about 275° F. and about 300° F.) and an elevated atmospheric pressure (commonly between about 150 psig and about 190 psig) until there is complete adhesion of the interlayer to the glass and complete dissolution of air trapped within the interlayer. It is not uncommon for the autoclave operation to last two hours or four hours per treatment. Various autoclave methods are known to skilled artisans.

In other cases, the laminated glass panel 100 is made by a non-autoclave process. Suitable processes of this nature are described in U.S. Pat. Nos. 7,117,914 and 7,143,800, the teachings of which are hereby incorporated herein by reference.

In some embodiments where the low solar heat gain coating 50 is part of a laminated glass panel 100, the low solar heat gain coating is the only coating located between the two glass panes 10, 10'. Reference is made to FIG. 2.

In other embodiments, the laminated glass panel 100 also includes a low-emissivity coating 70. In the embodiment of FIG. 3, for example, the laminated glass panel 100 includes a low-emissivity coating 70 on the interior surface 26 of pane 10'. When provided, the low-emissivity coating 70 preferably includes at least one silver-inclusive film, which desirably contains more than 50% silver by weight (e.g., a metallic silver film). In certain preferred embodiments, the low-emissivity coating 70 includes three or more infrared-reflective films (e.g., silver-containing films). Low-emissivity coatings having three or more infrared-reflective films are described in U.S. patent application Ser. No. 11/546,152 and U.S. Pat. Nos. 7,572,511 and 7,572,510 and 7,572,509 and Ser. No. 11/545,211 and U.S. Pat. Nos. 7,342,716 and 7,339,728, the teachings of each of which are incorporated herein by reference. In other cases, the low-emissivity coating can be a "single silver" or "double silver" low-emissivity coating, which are well-known to skilled artisans. Advantageous coatings of this nature are commercially available from, for example, Cardinal CG Company (Eden Prairie, Minn., U.S.A.).

Thus, in certain preferred embodiments, the interior surface 26 of the second pane 10' bears a low-emissivity coating 70, and that coating includes three layers comprising silver. These embodiments provide, among other beneficial properties, particularly low visible transmission (e.g., lami $T_{vis}$ of less than 30%), exceptionally low solar transmission (e.g., lami $T_{solar}$ of less than 15%), and low solar heat gain coefficient (e.g., lami SHGC of less than 0.35). Moreover, when the preferred film compositions and thicknesses described above for the low solar heat gain coating 50 are used, the laminated glass panel can have exceptional visible reflection and color properties. Preferred reflection and color properties are discussed below.

Figure 4:
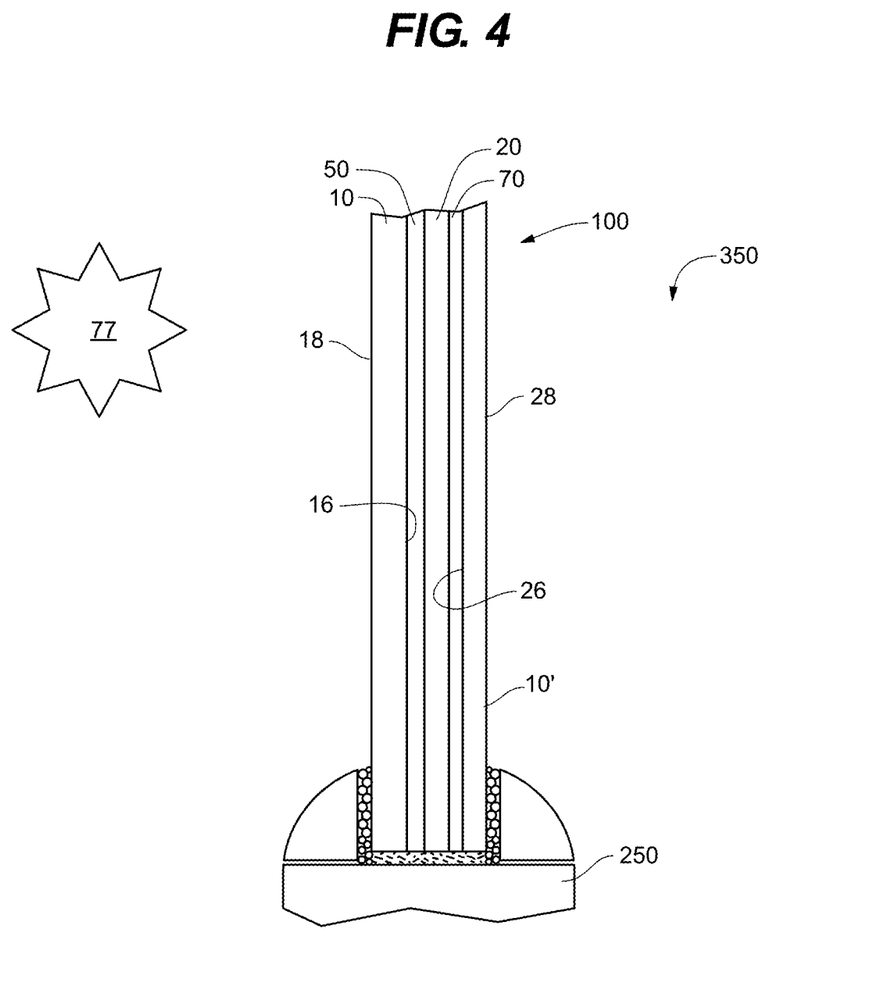
FIG. 4 is a broken-away schematic cross-sectional view of a laminated glass panel mounted in a frame in accordance with certain embodiments of the invention.

The laminated glass panel 100 can optionally be mounted in a frame (e.g., a window sash or window frame) 250 such that the exterior surface 18 of the outboard pane 10 is exposed to an outdoor environment 77 while the exterior surface 28 of the inboard pane 10' is exposed to an indoor (e.g., room-side) environment 350. Reference is made to FIG. 4.

In FIG. 4, the "first" (or "#1") surface is exposed to the outdoor environment 77. Accordingly, it is the #1 surface that radiation from the sun first strikes. Thus, the exterior surface 16 of the outboard pane 10 is the so-called first surface. Moving from the #1 surface toward the interior of the building, the next surface is the "second" (or "#2") surface. Thus, the interior surface 18 of the outboard pane 10 is the so-called second surface. Moving further toward the interior of the building, the next surface is the "third" (or "#3") surface, followed by the "fourth" (or "#4") surface. In FIG. 4, the interior surface 26 of the inboard pane 10' is the #3 surface, and the exterior surface 28 of that pane is the #4 surface.

The low solar heat gain coating 50 has a number of beneficial properties. The ensuing discussion reports several of these properties. In some cases, properties are reported herein for a single (i.e., monolithic) glass pane 10 bearing the low solar heat gain coating 50 on one surface 16, where the glass pane is clear 3 mm soda-lime float glass ("the present pane"). In other cases, properties are reported herein for a laminated glass panel 100 having the low solar heat gain coating 50 on the #2 surface, where both panes are clear 3 mm soda-lime float glass and the interlayer is 0.30 inch thick PVB ("the present panel"). In still other cases, properties are reported herein for a laminated glass panel 100 having the low solar heat gain coating 50 on the #2 surface and a triple silver low-emissivity coating 70 on the #3 surface. The triple silver low-emissivity coating is known commercially as the LoE$^3$-366™ product from Cardinal CG Company. The reported properties are for such a laminated glass panel wherein both panes are clear 3 mm soda-lime float glass and the interlayer is 0.30 inch thick PVB ("the present LowE panel"). The specifics in this paragraph are by no means limiting to the invention. For example, when provided, the low-emissivity coating 70 can alternatively be a single or double silver low-emissivity coating, etc. Absent an express statement to the contrary, the present disclosure reports determinations made using the well-known LBNL WINDOW 7.4 computer program (e.g., calculating center of glass data) under NFRC100-2010 conditions.

The low solar heat gain coating 50 has low emissivity. The emissivity of the coating 50 is less than 0.3. Preferably, the emissivity is less than 0.25, or even less than 0.20, such as about 0.19. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: $E=1-$Reflectance. The present emissivity values can be determined as specified in "Standard Test Method for Emittance of Specular Surfaces Using Spectrometric Measurements," NFRC 301-2017, the entire teachings of which are incorporated herein by reference.

In addition to low emissivity, the present coating 50 provides low UV transmission. Preferably, the UV transmission is less than 25%, less than 20%, or even less than 18% for the present pane. While the desired level of UV transmission can be selected and varied to accommodate different applications, some preferred embodiments (e.g., where coating 50 is one of the exemplary film stacks tabulated above) provide the present pane with a UV transmission of between 12% and 20%, such as about 16%. Moreover, for the present panel and the present LowE panel, the UV transmission is less than 5%, and preferably is less than 1%. The UV transmission reported herein is a weighted transmission from 300 nm-380 nm using the solar spectrum (AM1.5) found in ASTM G173, the salient teachings of which are hereby incorporated herein by reference.

The low solar heat gain coating 50 also provides low solar transmission. Preferably, the solar transmission is less than 40%, less than 35%, or even less than 30% for the present pane. While the desired level of solar transmission can be selected and varied to accommodate different applications, some preferred embodiments (e.g., where coating 50 is one of the exemplary film stacks tabulated above) provide the present pane with a solar transmission of between 25% and 33%, such as about 29%.

With respect to the present panel and the present LowE panel, the solar transmission is less than 30%, and preferably is less than 25%. While the desired level of solar transmission can be selected and varied to accommodate different applications, some preferred embodiments (e.g., where coating 50 is one of the exemplary film stacks tabulated above) provide: (i) the present panel with a solar transmission of between 20% and 28%, such as about 24%, and (ii) the present LowE panel with a solar transmission of between 4% and 12%, such as about 8%.

In any embodiment of the present disclosure, the present pane can optionally have an exterior solar reflectance of less than 0.18, and preferably less than 0.17, such as about 0.14-0.15. The solar transmission and solar reflectance reported herein are determined in accordance with NFRC 300-2017, the salient teachings of which are hereby incorporated herein by reference.

As noted above, coating 50 provides advantageous solar heat gain properties. As is well known, the solar heat gain coefficient (SHGC) of a window is the fraction of incident solar radiation that is admitted through a window. The present coating 50 provides a low SHGC. For example, the SHGC of the present pane is less than 0.5. Preferably, the present pane has a SHGC of less than 0.45. While the desired SHGC level can be selected and varied to accommodate different applications, some preferred embodiments (e.g., where coating 50 is one of the exemplary film stacks tabulated above) provide the present pane with a SHGC of between 0.36 and 0.44, such as about 0.40.

With respect to the present panel, it has a SHGC of less than 0.5, and preferably less than 0.45. While the desired SHGC level can be selected and varied to accommodate different applications, some preferred embodiments (e.g., where coating 50 is one of the exemplary film stacks tabulated above) provide the present panel with a SHGC of between 0.40 and 0.48, such as about 0.44.

With respect to the present lowE panel, it has a SHGC of less than 0.4, and preferably less than 0.35. While the desired SHGC level can be selected and varied to accommodate different applications, some preferred embodiments (e.g., where coating 50 is one of the exemplary film stacks tabulated above) provide the present lowE panel with a SHGC of between 0.28 and 0.36, such as about 0.32.

The term "solar heat gain coefficient" is used herein in accordance with its well-known meaning. Reference is made to NFRC 200-2017, the entire teachings of which are incorporated herein by reference. The SHGC can be calculated using the methodology embedded in the well-known LBNL WINDOW 7.4 computer program.

Preferably, the present pane has both a solar transmission of about 26% to 32% and a solar heat gain coefficient of about 0.37-0.43. This can optionally be in combination with: (i) the low solar heat gain coating 50 having an emissivity of less than 0.25, and (ii) the present pane having a UV transmission of between 12% and 20%. Furthermore, for any such embodiment, the thicknesses for the first indium tin oxide film 51, the first nickel compound film 52, the second indium tin oxide film 53, the second nickel compound film 54, and the overcoat layer 55 preferably are all within the first range (i.e., the broadest range) noted above for each such film, more preferably are all within the second range (i.e., the intermediate range) noted above for each such film, and perhaps optimally are all within the third range (i.e., the narrowest range) noted above for each such film.

The present pane, the present panel, and the present LowE panel preferably each have a visible transmission $T_v$ of less than 50%. Thus, for any embodiment of the present disclosure (including those described in the paragraph immediately above), the visible transmission can optionally be less than 50%. Preferably, the visible transmission $T_v$ is less than 40%, or even less than 35%, such as about 33% for the present pane, about 30-31% for the present panel, and about 22% for the present LowE panel.

The term "visible transmission" is well known in the art and is used herein in accordance with its well-known meaning to refer to the percentage of all incident visible radiation that is transmitted through the IG unit 110. Visible radiation constitutes the wavelength range of between about 380 nm and about 780 nm. Visible transmittance, as well as visible reflectance, can be determined in accordance with NFRC 300-2017, Standard Test Method for Determining the Solar and Infrared Optical Properties of Glazing Materials and Fading Resistance of Systems. The well-known LBNL WINDOW 7.4 computer program can be used in calculating these and other reported optical properties.

As noted above, a tradeoff is sometimes made in low solar heat gain coatings whereby the films selected to achieve a low SHGC have the effect of restricting the visible reflection to a higher level than is ideal. In contrast, the present low solar heat gain coating 50 has exceptional, surprising reflection properties.

The present pane, for example, has an exterior visible reflectance $R_{v,\ e}$ (off the glass side of the present pane) of less than 0.15. Preferably, the exterior visible reflectance $R_{v,\ e}$ of the present pane is less than 0.10, or even less than 0.07. While the precise level of exterior visible reflectance can be selected and varied in accordance with the present teachings, certain preferred embodiments (e.g., where coating 50 is one of the exemplary film stacks tabulated above) provide the present pane with an exterior visible reflectance $R_{v,\ e}$ of about 0.02-0.08, such as about 0.05.

The present pane also has an interior visible reflectance $R_{v,\ i}$ (off the film side of the present pane) of less than 0.15. Preferably, the present pane has interior visible reflectance $R_{v,\ e}$ of less than 0.10, or even less than 0.05. While the precise level of interior visible reflectance can be selected and varied in accordance with the present teachings, certain preferred embodiments (e.g., where coating 50 is one of the exemplary film stacks tabulated above) provide the present pane with an interior visible reflectance $R_{v,\ i}$ of about 0.01-0.05, such as about 0.03.

Thus, in certain embodiments, the present pane has an exterior visible reflectance $R_{v,\ e}$ and an interior visible reflectance $R_{v,\ i}$ that are each less than 0.10, or even less than 0.07. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present pane preferably has both a solar transmission of about 26% to 32% and a solar heat gain coefficient of about 0.37-0.43. This can optionally be in combination with: (i) the low solar heat gain coating 50 having an emissivity of less than 0.25, and (ii) the present pane having a UV transmission of between 12% and 20%.

The present panel has an exterior visible reflectance $R_{v,\ e}$ (off the #1 surface) of less than 0.15. Preferably, the present panel achieves an exterior visible reflectance $R_{v,\ e}$ of less than 0.10, or even less than 0.08. While the precise level of exterior visible reflectance can be selected and varied in accordance with the present teachings, certain preferred embodiments (e.g., where coating 50 is one of the exemplary film stacks tabulated above) provide the present panel with an exterior visible reflectance $R_{v,\ e}$ of about 0.03 to 0.09, such as about 0.06.

The present panel also has an interior visible reflectance $R_{v,\ i}$ (off the #4 surface) of less than 0.15. Preferably, the present panel achieves an interior visible reflectance $R_{v,\ i}$ of less than 0.10, or even less than 0.08. While the precise level of interior visible reflectance can be selected and varied in accordance with the present teachings, certain preferred embodiments (e.g., where coating 50 is one of the exemplary film stacks tabulated above) provide the present panel with an interior visible reflectance $R_{v,\ e}$ of about 0.03 to 0.09, such as about 0.06-0.07.

Thus, in certain embodiments, the present panel has an exterior visible reflectance $R_{v,\ e}$ and an interior visible reflectance $R_{v,\ i}$ that are each less than 0.10, or even less than 0.08. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present panel preferably has both a solar transmission of between 20% and 28% and a solar heat gain coefficient of between 0.40 and 0.48. This can optionally be in combination with: (i) the low solar heat gain coating 50 having an emissivity of less than 0.25, and (ii) the present panel having a UV transmission of less than 1%.

The present lowE panel has an exterior visible reflectance $R_{v,\ e}$ (off the #1 surface) of less than about 0.15. Preferably, the present lowE panel achieves an exterior visible reflectance $R_{v,\ e}$ of less than about 0.10, or even less than 0.08. While the precise level of exterior visible reflectance can be selected and varied in accordance with the present teachings, certain preferred embodiments (e.g., where coating 50 is one of the exemplary film stacks tabulated above) provide the present lowE panel with an exterior visible reflectance $R_{v,\ e}$ of about 0.04-0.10, such as about 0.07.

The present lowE panel also has an interior visible reflectance $R_{v,\ i}$ (off the #4 surface) of less than 0.15. Preferably, the present lowE panel achieves an interior visible reflectance $R_{v,\ i}$ of less than 0.14, or even less than 0.12. While the precise level of interior visible reflectance can be selected and varied in accordance with the present teachings, certain preferred embodiments (e.g., where coating 50 is one of the exemplary film stacks tabulated above) provide the present lowE panel with an interior visible reflectance $R_{v,\ i}$ of about 0.08-0.14, such as about 0.11.

Thus, in certain embodiments, the present lowE panel has an exterior visible reflectance $R_{v,\ e}$ and an interior visible reflectance $R_{v,\ i}$ that are each less than 0.15. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present lowE panel preferably has both a solar transmission of between 4% and 12% and a solar heat gain coefficient of between 0.28 and 0.36. This can optionally be in combination with: (i) the low solar heat gain coating 50 having an emissivity of less than 0.25, and (ii) the present lowE panel having a UV transmission of less than 1%.

The term "visible reflectance" is well known in the art. This term is used herein in accordance with its well-known meaning to refer to the percentage of all incident visible radiation that is reflected off the glass side of the present pane (which bears coating 50 on the opposite, film side), or off the film side of the present pane, or off the exterior (i.e., #1 surface) or interior (e.g., #4 surface) of a laminated glass panel. Skilled artisans will appreciate that the visible reflectance off the glass side of a monolithic pane includes not only visible radiation reflected at surface 18, but also visible radiation reflected at surface 16. Similarly, the visible reflectance off the exterior of a laminated glass panel includes not only visible radiation reflected at surface 18, but also visible radiation reflected at surfaces 16, 26, and 28. Skilled artisans will appreciate that the situation is similar for interior monolithic reflectance and interior laminated reflectance. The reported visible reflectance is measured off a central portion of the glass or film side of the monolithic coated pane, or off a central portion of the exterior surface of the outboard pane 10 or inboard pane 10' of the laminated glass panel. Visible reflectance can be determined as specified in the above-noted NFRC 300-2017, the salient teachings of which are hereby incorporated herein by reference.

The low solar heat gain coating 50 provides exceptional color properties. For example, the present pane has an exterior reflected color characterized by a chroma magnitude number of less than 10, preferably less than 5, or even less than 3. While the precise exterior reflected color properties can be selected and varied in accordance with the present teachings, certain preferred embodiments (e.g., where coating 50 is one of the exemplary film stacks tabulated above) provide the present pane with an exterior reflected color characterized by a chroma magnitude number in the range of 0.25-3.9, such as about 2.18.

Thus, in certain embodiments, the present pane has an exterior reflected color characterized by a chroma magnitude number in the range of 0.25-3.9. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present pane preferably has both a solar transmission of about 26% to 32% and a solar heat gain coefficient of about 0.37-0.43. This can optionally be in combination with: (i) the low solar heat gain coating 50 having an emissivity of less than 0.25, and (ii) the present pane having a UV transmission of between 12% and 20%. Furthermore, the present pane can optionally also have an exterior visible reflectance $R_{v,\,e}$ of about 0.02-0.08, an interior visible reflectance $R_{v,\,i}$ of about 0.01-0.05, or both.

With respect to the present panel, it preferably has an exterior reflected color characterized by a chroma magnitude number of less than 5, or even less than 3. While the precise exterior reflected color properties can be selected and varied in accordance with the present teachings, certain preferred embodiments (e.g., where coating 50 is one of the exemplary film stacks tabulated above) provide the present panel with an exterior reflected color characterized by a chroma magnitude number in the range of 0.1-3.8, such as about 0.98 or about 2.12.

In addition, the present panel exhibits an interior reflected color that ranges from good to exceptional. Preferably, the interior reflected color of the present panel is characterized by a chroma magnitude number of less than 10. While the precise interior reflected color properties can be selected and varied in accordance with the present teachings, some preferred embodiments (e.g., where coating 50 is the first exemplary film stack tabulated above) provide the present panel with an interior reflected color characterized by a chroma magnitude number in the range of 7-13, such as about 9.97. In other cases, it less than 5, or even less than 3. For example, other preferred embodiments (e.g., where coating 50 is the second exemplary film stack tabulated above) provide the present panel with an interior reflected color characterized by a chroma magnitude number in the range of 0.15-3.7, such as about 0.92.

Thus, in certain embodiments, the present panel has an exterior reflected color characterized by a chroma magnitude number in the range of 0.1-3.8, an interior reflected color characterized by a chroma magnitude number in the range of 0.15-3.7, or both. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present panel preferably has both a solar transmission of between 20% and 28% and a solar heat gain coefficient of between 0.40 and 0.48. This can optionally be in combination with: (i) the low solar heat gain coating 50 having an emissivity of less than 0.25, and (ii) the present panel having a UV transmission of less than 1%. Furthermore, the present panel can optionally also have an exterior visible reflectance $R_{v,\,e}$ of about 0.03 to 0.09, an interior visible reflectance $R_{v,\,i}$ of about 0.03 to 0.09, or both.

With respect to the present lowE panel, it preferably has an exterior reflected color characterized by a chroma magnitude number of less than 5, or even less than 3. While the precise exterior reflected color properties can be selected and varied in accordance with the present teachings, certain preferred embodiments (e.g., where coating 50 is one of the exemplary film stacks tabulated above) provide the present lowE panel with an exterior reflected color characterized by a chroma magnitude number in the range of 0.18-3.9, such as about 0.99.

Thus, in certain embodiments, the present lowE panel has an exterior reflected color characterized by a chroma magnitude number in the range of 0.18-3.9. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present lowE panel preferably has both a solar transmission of between 4% and 12% and a solar heat gain coefficient of between 0.28 and 0.36. This can optionally be in combination with: (i) the low solar heat gain coating 50 having an emissivity of less than 0.25, and (ii) the present lowE panel having a UV transmission of less than 1%. Furthermore, the present lowE panel can optionally also have an exterior visible reflectance $R_{v,e}$ of about 0.04-0.10, an interior visible reflectance $R_{v,i}$ of about 0.08-0.14, or both.

With respect to the present pane, in certain preferred embodiments (e.g., where coating 50 is one of the exemplary film stacks tabulated above), the present pane exhibits an exterior reflected color characterized by an "a" color coordinate of between –6 and 2 (e.g., between –4 and 0, such as about –2.1) and a "b" color coordinate of between –4.5 and 3.5 (e.g., –2.5 and 1.5, such as about –0.6).

In addition to having exterior reflected color within one or each range recited in the previous paragraph, the present pane preferably has an exterior reflected color characterized by a chroma magnitude number in the range of 0.25-3.9. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present pane preferably has both a solar transmission of about 26% to 32% and a solar heat gain coefficient of about 0.37-0.43. This can optionally be in combination with: (i) the low solar heat gain coating 50 having an emissivity of less than 0.25, and (ii) the present pane having a UV transmission of between 12% and 20%. Furthermore, the present pane can optionally also have an exterior visible reflectance $R_{v,e}$ of about 0.02-0.08, an interior visible reflectance $R_{v,i}$ of about 0.01-0.05, or both.

With respect to the present panel, in certain preferred embodiments (e.g., where coating 50 is one of the exemplary film stacks tabulated above), the present panel exhibits an exterior reflected color characterized by an "a" color coordinate of between –3.5 and 2.5 (e.g., between –2.5 and 1.5, such as about –0.25) and a "b" color coordinate of between –2 and 4 (e.g., –1 and 3, such as about 0.95).

In addition to having exterior reflected color within one or each range recited in the previous paragraph, the present panel preferably has an exterior reflected color characterized by a chroma magnitude number in the range of 0.1-3.8. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present panel preferably has both a solar transmission of between 20% and 28% and a solar heat gain coefficient of between 0.40 and 0.48. This can optionally be in combination with: (i) the low solar heat gain coating 50 having an emissivity of less than 0.25, and (ii) the present panel having a UV transmission of less than 1%. Furthermore, the present panel can optionally also have an exterior visible reflectance $R_{v,e}$ of about 0.03 to 0.09, an interior visible reflectance of about 0.03 to 0.09, or both.

With respect to the present lowE panel 100, in certain preferred embodiments (e.g., where coating 50 is one of the exemplary film stacks tabulated above), the present lowE panel exhibits an exterior reflected color characterized by an "a" color coordinate of between –3.5 and 2.5 (e.g., between –2.5 and 1.5, such as about –0.37) and a "b" color coordinate of between –2 and 4 (e.g., –1 and 3, such as about 0.92).

In addition to having exterior reflected color within one or each range recited in the previous paragraph, the present lowE panel preferably has an exterior reflected color characterized by a chroma magnitude number in the range of 0.18-3.9. This can optionally be in combination with the thicknesses for the first indium tin oxide film 51, the first nickel compound film 52, the second indium tin oxide film 53, the second nickel compound film 54, and the overcoat layer 55 all being within the first range (i.e., the broadest range) noted above for each such film, more preferably all being within the second range (i.e., the intermediate range) noted above for each such film, and perhaps optimally all being within the third range (i.e., the narrowest range) noted above for each such film. In addition, the present lowE panel preferably has both a solar transmission of between 4% and 12% and a solar heat gain coefficient of between 0.28 and 0.36. This can optionally be in combination with: (i) the low solar heat gain coating 50 having an emissivity of less than 0.25, and (ii) the present lowE panel having a UV transmission of less than 1%. Furthermore, the present lowE panel can optionally also have an exterior visible reflectance $R_{v,e}$ of about 0.04-0.10, an interior visible reflectance $R_{v,i}$ of about 0.08-0.14, or both.

The present discussion of color properties is reported using the well-known color coordinates of "a" and "b." In more detail, the color coordinates are indicated herein using the subscript h (i.e., $a_h$ and $b_h$) to represent the conventional use of the well-known Hunter Lab Color System (Hunter methods/units, Ill. D65, 10 degree observer). The present color properties can be calculated as specified in "Insight on Color," "Hunter L, a, b Color Scale," Applications Note, Vol. 8, No. 9, 06/08 (2008), the relevant teachings of which are incorporated herein by reference. For purposes of the present disclosure, the chroma magnitude number is defined as the square root of $[a^2+b^2]$.

In one group of embodiments, the laminated glass panel 100 has an exterior reflected color characterized by a chroma magnitude number of less than 1. As one example, when the present panel employs coating 50 in the form of the first exemplary film stack tabulated above, the exterior reflected color is characterized by a chroma magnitude number of about 0.98. As another example, when the present lowE panel employs coating 50 in the form of the first exemplary film stack tabulated above, the exterior reflected color is characterized by a chroma magnitude number of about 0.99. Given the present teachings as a guide, skilled artisans will be able to provide various other ITO-based coatings to achieve the low chroma magnitude number of this embodiment group. In the present group of embodiments, the low solar heat gain coating 50 preferably comprises two indium tin oxide films. In more detail, the low solar heat gain coating 50 in these embodiments preferably comprises, in sequence moving toward the interlayer, a first indium tin oxide film, a first nickel compound film, a second indium tin oxide film, a second nickel compound film, and an overcoat layer. Preferably, the first indium tin oxide film 51 has a thickness of between 480 Å and 725 Å, the first nickel compound film 52 has a thickness of between 80 Å and 120 Å, the second indium tin oxide film 53 has a thickness of between 580 Å and 870 Å, and the second nickel compound film 54 has a thickness of between 65 Å and 100 Å.

The invention also provides methods for producing the low solar heat gain coating 50. In the present methods, a substrate 10 having a surface 16 is provided. If desired, this surface 16 can be prepared by suitable washing or chemical preparation. The coating 50 is deposited on the surface 16 of the substrate 10, e.g., as a series of discrete layers, as a thickness of graded film, or as a combination including at least one discrete layer and at least one thickness of graded film. The coating can be deposited using any thin film deposition technique that is suitable for depositing the desired film materials at the desired thicknesses. Thus, the present invention includes method embodiments wherein, using any one or more suitable thin film deposition techniques, the films of any embodiment disclosed herein are deposited sequentially upon a substrate (e.g., a sheet of glass or plastic) 10. In preferred embodiments, the films are deposited by sputtering. Sputtering is well known in the present art. One preferred method uses DC magnetron sputtering, which is commonly known in industry. Reference is made to Chapin's U.S. Pat. No. 4,166,018, the teachings of which are incorporated herein by reference. In some cases, the present coatings are sputtered by AC or pulsed DC from a pair of cathodes. HiPIMS and other modern sputtering methods can be used as well.

Briefly, magnetron sputtering involves transporting a substrate 10 through a series of low pressure zones (or "chambers" or "bays") in which the various films that make up the coating are sequentially applied. To deposit oxide film, the target may be formed of an oxide itself, and the sputtering may proceed in an inert or oxidizing atmosphere. To deposit indium tin oxide, for example, a ceramic indium tin oxide target can be sputtered in an inert or oxidizing atmosphere. Alternatively, the oxide film can be deposited by sputtering one or more metallic targets (e.g., of metallic indium tin material) in a reactive atmosphere. Nickel alloy film (e.g., Ni—Al) can be deposited by sputtering one or more nickel alloy (e.g., Ni—Al) targets. Silicon nitride can be deposited by sputtering one or more silicon targets (which may be doped with aluminum or the like to improve conductivity) in a reactive atmosphere containing nitrogen gas. Silicon oxynitride can be deposited by sputtering one or more silicon targets (which may be doped with aluminum or the like) in a reactive atmosphere containing oxygen and nitrogen gas. Tin oxide can be deposited by sputtering one or more tin targets in a reactive atmosphere containing oxygen gas. The thicknesses of the deposited films can be controlled by varying the speed of the substrate, by varying the power on the targets, or by varying the ratio of power to partial pressure of the reactive gas.

Following is a first non-limiting process for depositing one embodiment of the low solar heat gain coating 50 onto a glass pane. A pair of rotatable metallic indium-tin targets is sputtered while an uncoated glass pane is conveyed past the activated targets at a rate of about 88 inches per minute when depositing the first indium tin oxide film 51. In this example, the relative weight amounts of the two metals in the sputterable material of the target is: indium 90%, tin 10%. Here, a power of 10.6 kW is used for the pair of rotary targets. The sputtering atmosphere is 6 mTorr with a gas flow of 72% argon and 28% oxygen. The resulting indium tin oxide film has a thickness of about 600 Å. Directly over this first ITO film, a first nickel-aluminum film is applied. Here, the nickel-aluminum is applied at a thickness of about 100 Å by conveying the glass pane at about 112 inches per minute past a pair of rotary Ni—Al targets sputtered at 4.8 kW in a 5 mTorr atmosphere with a gas flow of 100% argon. Directly over the first nickel-aluminum film, a second indium tin oxide film is applied. A pair of rotatable metallic indium-tin targets is sputtered while the glass pane is conveyed past the activated targets at a rate of about 73 inches per minute when depositing the second indium tin oxide film. The relative weight amounts of the two metals in the sputterable material of the target is: indium 90%, tin 10%. A power of 10.6 kW is used for the pair of rotary targets. The sputtering atmosphere is 6 mTorr with a gas flow of 72% argon and 28% oxygen. The resulting indium tin oxide film has a thickness of about 725 Å. Directly over this second ITO film, a second nickel-aluminum film is applied. Here, the nickel-aluminum is applied at a thickness of about 85 Å by conveying the glass pane at about 112 inches per minute past a pair of rotary Ni—Al targets sputtered at 4 kW in a 5 mTorr atmosphere with a gas flow of 100% argon. Finally, a silicon oxynitride film is applied at a thickness of about 660 Å by conveying the glass pane at about 36 inches per minute in two passes beneath a pair of rotary silicon targets (83% Si, 17% Al, by weight) sputtered at 20.1 kW in a 5 mTorr atmosphere with a gas flow of 90% nitrogen and 10% oxygen.

Following is a second non-limiting process for depositing another embodiment of the low solar heat gain coating 50 onto a glass pane. A pair of rotatable metallic indium-tin targets is sputtered while an uncoated glass pane is conveyed past the activated targets at a rate of about 105 inches per minute when depositing the first indium tin oxide film. The relative weight amount of the two metals in the sputterable material of the target is: indium 90%, tin 10%. Here, a power of 10.6 kW is used for the pair of rotary targets. The sputtering atmosphere is 6 mTorr with a gas flow of 72% argon and 28% oxygen. The resulting indium tin oxide film has a thickness of about 505 Å. Directly over this first ITO film, a first nickel-aluminum film is applied at a thickness of about 90 Å by conveying the glass pane at about 112 inches per minute past a pair of rotary Ni—Al targets sputtered at 4.4 kW in a 5 mTorr atmosphere with a gas flow of 100% argon. Directly over the first nickel-aluminum film, a second indium tin oxide film is applied. A pair of rotatable metallic indium-tin targets is sputtered while the glass pane is conveyed past the activated targets at a rate of about 72 inches per minute when depositing the second indium tin oxide film. Here again, the relative weight amounts of the two metals in the sputterable material of the target is: indium 90%, tin 10%. A power of 10.6 kW is used for the pair of rotary targets. The sputtering atmosphere is 6 mTorr with a gas flow of 72% argon and 28% oxygen. The resulting indium tin oxide film has a thickness of about 735 Å. Directly over this second ITO film, a second nickel-aluminum film is applied. Here, the nickel-aluminum is applied at a thickness of about 90 Å by conveying the glass pane at about 112 inches per minute past a pair of rotary Ni—Al targets sputtered at 4.4 kW in a 5 mTorr atmosphere with a gas flow of 100% argon. Finally, a silicon nitride film is applied at a thickness of about 660 Å by conveying the glass pane at about 36 inches per minute in two passes beneath a pair of rotary silicon targets (83% Si, 17% Al, by weight) sputtered at 19.8 kW in a 5 mTorr atmosphere with a gas flow of 100% nitrogen.

Once the glass pane has been coated, it preferably is heat treated. Various heat treatment processes can be used. For example, the coated pane can be heat treated on a conventional production tempering line. In tempering, glass is placed in a furnace maintained at about 680-705° C. (preferably controlled to 690-700° C.). The glass is typically held in the furnace for 100-120 seconds with constant movement to better ensure temperature uniformity of the product. This is intended to raise the glass temperature to about 640° C. The glass is then removed from the furnace and placed in a stream of air for about 50 seconds such that the glass is cool enough for an operator to handle. Another option is to heat treat the coated glass pane by a flash treatment method of the type described above. Moreover, as already explained, the substrate can alternatively be heated prior to film deposition, during deposition, or both.

While some preferred embodiments of the invention have been described, it should be understood that various changes, adaptations and modifications may be made therein without departing from the spirit of the invention and the scope of the appended claims.

What is claimed is:

1. A coated glass pane having a surface that bears a low solar heat gain coating, the low solar heat gain coating comprising, in sequence moving outwardly from the surface, a first indium tin oxide film, a first nickel compound film, a second indium tin oxide film, a second nickel compound film, and an overcoat layer, the first indium tin oxide film having a thickness of between 480 Å and 725 Å, the first nickel compound film having a thickness of between 80 Å and 120 Å, the second indium tin oxide film having a thickness of between 580 Å and 870 Å, and the second nickel compound film having a thickness of between 65 Å and 100 Å, wherein the first nickel compound film is in contact with both the first and second indium tin oxide films.

2. The coated glass pane of claim 1 wherein the coated glass pane has a visible transmission of less than 50%.

3. The coated glass pane of claim 1 wherein the coated glass pane has an exterior visible reflectance of less than 0.10.

4. The coated glass pane of claim 3 wherein the coated glass pane has an interior visible reflectance of less than 0.10.

5. The coated glass pane of claim 1 wherein the coated glass pane has an exterior reflected color characterized by a chroma magnitude number of less than 5.

6. The coated glass pane of claim 1 wherein the second indium tin oxide film is in contact with the second nickel compound film.

7. The coated glass pane of claim 6 wherein the overcoat layer is in contact with the second nickel compound film, and the overcoat layer is an outermost film of the low solar heat gain coating.

8. The coated glass pane of claim 1 wherein the thickness of the first indium tin oxide film is between 540 Å and 660 Å, the thickness of the first nickel compound film is between 90 Å and 110 Å, the thickness of the second indium tin oxide film is between 650 Å and 800 Å, and the thickness of the second nickel compound film is between 70 Å and 95 Å.

9. The coated glass pane of claim 1 wherein the first and second nickel compound films both comprise nickel aluminum.

10. The coated glass pane of claim 1 wherein the coated glass pane has an exterior reflected color characterized by an "$a_h$" color coordinate of between −6 and 2 and a "$b_h$" color coordinate of between −4.5 and 3.5.

11. The coated glass pane of claim 1 wherein the coated glass pane has a solar transmission of from 26% to 32% and a solar heat gain coefficient of about 0.37-0.43.

12. The coated glass pane of claim 1 wherein the second indium tin oxide film is at least 100 Å thicker than the first indium tin oxide film.

13. The coated glass pane of claim 1 wherein the coated glass pane has a UV transmission of less than 18% and an exterior solar reflectance of less than 0.17.

14. A laminated glass panel including two glass panes and an interlayer, the interlayer sandwiched between the two glass panes and bonded thereto, at least one of the two glass panes having an interior surface that bears a coating, the coating comprising, in sequence moving away from said interior surface and toward the interlayer, a first indium tin oxide film, a first nickel aluminum film, a second indium tin oxide film, a second nickel aluminum film, and an overcoat layer, the first indium tin oxide film having a thickness of between 480 Å and 725 Å, the first nickel aluminum film having a thickness of between 80 Å and 120 Å, the second indium tin oxide film having a thickness of between 580 Å and 870 Å, and the second nickel aluminum film having a thickness of between 65 Å and 100 Å, wherein the first nickel aluminum film is in contact with both the first and second indium tin oxide films.

15. The laminated glass panel of claim 14 wherein the first indium tin oxide film is in contact with the first nickel aluminum film, and the second indium tin oxide film is in contact with the second nickel aluminum film.

16. The laminated glass panel of claim 14 wherein the laminated glass panel has a visible transmission of less than 35%.

17. The laminated glass panel of claim 14 wherein the laminated glass panel has an exterior visible reflectance of less than 8%.

18. The laminated glass panel of claim 17 wherein the laminated glass panel has an interior visible reflectance of less than 8%.

19. The laminated glass panel of claim 14 wherein the laminated glass panel has an exterior reflected color characterized by a chroma magnitude number of less than 3.

20. The laminated glass panel of claim 14 wherein the laminated glass panel has an exterior reflected color characterized by an "$a_h$" color coordinate of between −3.5 and 2.5 and a "$b_h$" color coordinate of between −2 and 4.

21. The laminated glass panel of claim 14 wherein the overcoat layer is an outermost film of the coating such that the overcoat layer is in contact with the interlayer.

22. The laminated glass panel of claim 21 wherein the overcoat layer has a thickness of between 530 Å and 800 Å.

23. The laminated glass panel of claim 14 wherein the coating is devoid of a silver layer.

24. The laminated glass panel of claim 14 wherein the thickness of the first indium tin oxide film is between 540 Å and 660 Å, the thickness of the first nickel-aluminum film is between 90 Å and 110 Å, the thickness of the second indium tin oxide film is between 650 Å and 800 Å, and the thickness of the second nickel-aluminum film is between 70 Å and 95 Å.

25. A laminated glass panel including first and second glass panes and an interlayer, at least one of the two glass panes having an interior surface that bears an ITO-based coating, wherein the ITO-based coating comprises, in sequence moving away from said interior surface and toward the interlayer, a first indium tin oxide film, a first nickel compound film, a second indium tin oxide film, a second nickel compound film, and an overcoat layer, the first indium tin oxide film having a thickness of between 480 Å and 725 Å, the first nickel compound film having a thickness of between 80 Å and 120 Å, the second indium tin oxide film having a thickness of between 580 Å and 870 Å, and the second nickel compound film having a thickness of between 65 Å and 100 Å, wherein the first nickel compound film is in contact with both the first and second indium tin oxide films, the interlayer being sandwiched between the first and second glass panes, the laminated glass panel having an exterior reflected color characterized by a chroma magnitude number of less than 1.

26. A laminated glass panel including first and second glass panes and an interlayer, the interlayer being sandwiched between the first and second glass panes, the first glass pane having an interior surface facing the interlayer, the second glass pane having an interior surface facing the interlayer, the interior surface of the first glass pane bearing an ITO-based coating, wherein the ITO-based coating comprises, in sequence moving away from the interior surface of the first glass pane and toward the interlayer, a first indium tin oxide film, a first nickel-aluminum film, a second indium tin oxide film, a second nickel-aluminum film, and an overcoat layer, wherein the first indium tin oxide film has a thickness of between 480 Å and 725 Å, the first nickel-aluminum film has a thickness of between 80 Å and 120 Å, the second indium tin oxide film has a thickness of between 580 Å and 870 Å, and the second nickel-aluminum film has a thickness of between 65 Å and 100 Å, wherein the first nickel-aluminum film is in contact with both the first and second indium tin oxide films, the interior surface of the second glass pane bearing a low-emissivity coating, the low-emissivity coating comprising three silver layers.

27. The laminated glass panel of claim 26 wherein the laminated glass panel has a visible transmission of less than 25%.

28. The laminated glass panel of claim 26 wherein the laminated glass panel has a solar transmission of less than 25% and a solar heat gain coefficient of less than 0.35.

29. The laminated glass panel of claim 26 wherein the laminated glass panel has an exterior visible reflectance of less than 0.08.

30. The laminated glass panel of claim 26 wherein the laminated glass panel has an exterior reflected color characterized by a chroma magnitude number of less than 3.

31. The laminated glass panel of claim 26 wherein the laminated glass panel has an exterior reflected color characterized by an "$a_h$" color coordinate of between −3.5 and 2.5 and a "$b_h$" color coordinate of between −2 and 4.

32. The laminated glass panel of claim 26 wherein the thickness of the first indium tin oxide film is between 540 Å and 660 Å, the thickness of the first nickel-aluminum film is between 90 Å and 110 Å, the thickness of the second indium tin oxide film is between 650 Å and 800 Å, and the thickness of the second nickel-aluminum film is between 70 Å and 95 Å.

* * * * *